(12) United States Patent
Choi et al.

(10) Patent No.: US 10,847,585 B2
(45) Date of Patent: *Nov. 24, 2020

(54) ORGANIC LIGHT EMITTING DISPLAY DEVICE INCLUDING A SOUND GENERATING APPARATUS

(71) Applicant: LG Display Co., Ltd., Seoul (KR)

(72) Inventors: YeongRak Choi, Paju-si (KR); ChangHo Oh, Seoul (KR); KwanHo Park, Incheon (KR); Sungtae Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/785,397

(22) Filed: Oct. 16, 2017

(65) Prior Publication Data

US 2018/0053813 A1 Feb. 22, 2018

Related U.S. Application Data

(63) Continuation of application No. 15/388,939, filed on Dec. 22, 2016, now Pat. No. 9,818,805.

(30) Foreign Application Priority Data

Apr. 5, 2016 (KR) .......................... 10-2016-0041384

(51) Int. Cl.
*H01L 27/32* (2006.01)
*G06F 1/16* (2006.01)
(Continued)

(52) U.S. Cl.
CPC ........ *H01L 27/3225* (2013.01); *G06F 1/1605* (2013.01); *G06F 1/1637* (2013.01);
(Continued)

(58) Field of Classification Search
CPC ............. H01L 27/3258; H01L 51/5237; H01L 51/524; H01L 51/525; G06F 3/016;
(Continued)

(56) References Cited

U.S. PATENT DOCUMENTS 4,675,907 A 6/1987 Itagaki et al.
4,891,842 A 1/1990 Green
(Continued)

FOREIGN PATENT DOCUMENTS

CN 1243652 A 2/2000
CN 1547416 A 11/2004
(Continued)

OTHER PUBLICATIONS

Office Action dated Mar. 27, 2017, from the Korean Patent Office in related Application No. 10-2016-0146951. Note: KR 10-2015-0133918, JP 2009-100223, and JP 2007-300578 cited therein are already of record.
(Continued)

*Primary Examiner* — Kent W Chang
*Assistant Examiner* — Scott Au
(74) *Attorney, Agent, or Firm* — Morgan, Lewis & Bockius LLP

(57) ABSTRACT

Embodiments of the present disclosure relate to an organic light emitting display device which directly vibrates an organic light emitting display panel to generate sound, and includes: an organic light emitting display panel including a light emitting layer including an organic light emitting material layer and an encapsulation layer disposed at one side of the light emitting layer; and a sound generating actuator in direct contact with the organic light emitting display panel to vibrate the organic light emitting display panel to generate sound. Especially, the organic light emitting display panel is a bottom emission type device, and thus
(Continued)

can prevent generation of a weighted color mixing phenomenon in a wide viewing angle at the time of panel vibration and reduce the thickness or weight of the panel to thereby enhance the sound generation characteristic.

21 Claims, 25 Drawing Sheets

(51) Int. Cl.
| | |
|---|---|
| *H04R 7/20* | (2006.01) |
| *H04R 9/02* | (2006.01) |
| *H01L 51/52* | (2006.01) |
| *H04R 1/02* | (2006.01) |
| *H04R 7/06* | (2006.01) |
| *H04R 9/04* | (2006.01) |
| *H04R 9/06* | (2006.01) |
| *H04R 7/04* | (2006.01) |
| *H04R 7/10* | (2006.01) |

(52) U.S. Cl.
CPC .......... *G06F 1/1688* (2013.01); *H01L 27/322* (2013.01); *H01L 27/3262* (2013.01); *H01L 51/5246* (2013.01); *H04R 1/028* (2013.01); *H04R 7/06* (2013.01); *H04R 7/20* (2013.01); *H04R 9/025* (2013.01); *H04R 9/045* (2013.01); *H04R 9/06* (2013.01); *H04R 7/045* (2013.01); *H04R 7/10* (2013.01); *H04R 2307/023* (2013.01); *H04R 2307/025* (2013.01); *H04R 2440/05* (2013.01); *H04R 2499/15* (2013.01)

(58) Field of Classification Search
CPC . G06F 1/1615; G06F 1/1622; H04R 2499/15; H04R 2499/11; H04R 17/00; H04R 7/10
See application file for complete search history.

(56) References Cited

U.S. PATENT DOCUMENTS

| | | | |
|---|---|---|---|
| 5,025,474 A | 6/1991 | Tanaka et al. | |
| 5,535,028 A | 7/1996 | Bae et al. | |
| 5,796,854 A | 8/1998 | Markow | |
| 5,856,819 A | 1/1999 | Vossler | |
| 6,137,890 A | 10/2000 | Markow | |
| 6,208,237 B1 | 3/2001 | Saiki et al. | |
| 6,238,755 B1 | 5/2001 | Harvey et al. | |
| 6,342,831 B1 | 1/2002 | Azima | |
| 6,443,586 B1 | 9/2002 | Azima et al. | |
| 6,610,237 B2 | 8/2003 | Azima et al. | |
| 6,618,487 B1 | 9/2003 | Azima et al. | |
| 6,677,384 B1 | 1/2004 | Ikemoto et al. | |
| 6,751,329 B2 | 6/2004 | Colloms et al. | |
| 6,795,561 B1 | 9/2004 | Bank | |
| 6,819,309 B1 | 11/2004 | Kishi | |
| 6,826,285 B2 | 11/2004 | Azima | |
| 6,871,149 B2 | 3/2005 | Sullivan et al. | |
| 6,911,901 B2 | 6/2005 | Bown | |
| 6,922,642 B2 | 7/2005 | Sullivan | |
| 6,937,124 B1 | 8/2005 | Nakamura et al. | |
| 6,956,957 B1 | 10/2005 | Azima et al. | |
| 6,985,596 B2 | 1/2006 | Bank et al. | |
| 7,020,302 B2 | 3/2006 | Konishi et al. | |
| 7,050,600 B2 | 5/2006 | Saiki et al. | |
| 7,120,264 B2 | 10/2006 | Saiki et al. | |
| 7,157,649 B2 | 1/2007 | Hill | |
| 7,158,651 B2 | 1/2007 | Bachmann et al. | |
| 7,174,025 B2 | 2/2007 | Azima et al. | |
| 7,184,898 B2 | 2/2007 | Sullivan et al. | |
| 7,215,329 B2 | 5/2007 | Yoshikawa et al. | |
| 7,305,248 B2 | 12/2007 | Mori | |
| 7,372,110 B2 | 5/2008 | Hatano | |
| 7,376,523 B2 | 5/2008 | Sullivan et al. | |
| 7,382,890 B2 | 6/2008 | Saiki et al. | |
| 7,536,211 B2 | 5/2009 | Saiki et al. | |
| 7,545,459 B2 | 6/2009 | Fujiwara et al. | |
| 7,564,984 B2 | 7/2009 | Bank et al. | |
| 7,570,771 B2 | 8/2009 | Whitwell et al. | |
| 7,593,159 B2 | 9/2009 | Yokoyama et al. | |
| 7,657,042 B2 | 2/2010 | Miyata | |
| 7,764,803 B2 | 7/2010 | Kang | |
| 7,769,191 B2 | 8/2010 | Lee et al. | |
| 7,800,702 B2 | 9/2010 | Tsuboi et al. | |
| 7,903,091 B2 | 3/2011 | Lee et al. | |
| 8,174,495 B2 | 5/2012 | Takashima et al. | |
| 8,174,511 B2 | 5/2012 | Takenaka et al. | |
| 8,180,074 B2 | 5/2012 | Ko et al. | |
| 8,194,894 B2 | 6/2012 | Burton et al. | |
| 8,274,480 B2 | 9/2012 | Sullivan | |
| 8,736,558 B2 | 5/2014 | East et al. | |
| 8,830,211 B2 | 9/2014 | Hill | |
| 8,879,766 B1 | 11/2014 | Zhang | |
| 8,917,168 B2 | 12/2014 | Kono et al. | |
| 8,934,228 B2 | 1/2015 | Franklin et al. | |
| 9,001,060 B2 | 4/2015 | Harris | |
| 9,030,447 B2 | 5/2015 | Hsu | |
| 9,035,918 B2 | 5/2015 | Harris et al. | |
| 9,041,662 B2 | 5/2015 | Harris | |
| 9,046,949 B2 | 6/2015 | Adachi et al. | |
| 9,107,006 B2 | 8/2015 | Wang et al. | |
| 9,122,011 B2 | 9/2015 | Oh et al. | |
| 9,131,301 B2 | 9/2015 | Tsai et al. | |
| 9,137,592 B2 | 9/2015 | Yliaho et al. | |
| 9,148,716 B2 | 9/2015 | Liu et al. | |
| 9,173,014 B2 | 10/2015 | Park | |
| 9,191,749 B2 | 11/2015 | Nabata et al. | |
| 9,197,966 B2 | 11/2015 | Umehara et al. | |
| 9,204,223 B2 | 12/2015 | Nabata et al. | |
| 9,285,882 B2 | 3/2016 | Wang et al. | |
| 9,288,564 B2 | 3/2016 | Faerstain et al. | |
| 9,300,770 B2 | 3/2016 | Nabata et al. | |
| 9,317,063 B2 | 4/2016 | Kwon et al. | |
| 9,332,098 B2 | 5/2016 | Horii | |
| 9,350,832 B2 | 5/2016 | Horii | |
| 9,357,280 B2 | 5/2016 | Mellow et al. | |
| 9,363,591 B2 | 6/2016 | Ozasa et al. | |
| 9,363,607 B2 | 6/2016 | Ando | |
| 9,380,366 B2 | 6/2016 | Kang et al. | |
| 9,389,688 B2 | 7/2016 | Tossavainen et al. | |
| 9,398,358 B2 | 7/2016 | Louh | |
| 9,436,320 B2 | 9/2016 | Kang et al. | |
| 9,544,671 B2 | 1/2017 | Shi et al. | |
| 9,609,438 B2 | 3/2017 | Kim et al. | |
| 9,654,863 B2 | 5/2017 | Crosby et al. | |
| 9,818,805 B2 * | 11/2017 | Choi .................... G06F 1/1637 |
| 10,009,683 B2 * | 6/2018 | Choi .................... H04R 1/028 |
| 10,129,646 B2 | 11/2018 | Choi et al. | |
| 2001/0040976 A1 | 11/2001 | Buos | |
| 2001/0043714 A1 | 11/2001 | Asada | |
| 2002/0018574 A1 | 2/2002 | Okuno et al. | |
| 2002/0064290 A1 | 5/2002 | Reynaga et al. | |
| 2002/0141607 A1 | 10/2002 | Azima et al. | |
| 2003/0128503 A1 | 7/2003 | Takahashi | |
| 2003/0233794 A1 | 12/2003 | Pylkki et al. | |
| 2004/0008859 A1 | 1/2004 | Zhao | |
| 2004/0184622 A1 | 9/2004 | Ohashi | |
| 2005/0129258 A1 | 6/2005 | Fincham | |
| 2005/0129265 A1 | 6/2005 | Nakajima et al. | |
| 2006/0018503 A1 | 1/2006 | Endo | |
| 2006/0078153 A1 | 4/2006 | Sato | |
| 2006/0120542 A1 | 6/2006 | Lee | |
| 2006/0126885 A1 | 6/2006 | Combest | |
| 2006/0140439 A1 | 6/2006 | Nakagawa | |
| 2006/0187140 A1 | 8/2006 | Brask | |
| 2007/0019134 A1 | 1/2007 | Park et al. | |
| 2007/0036388 A1 | 2/2007 | Lee et al. | |
| 2007/0187172 A1 | 8/2007 | Kaneda et al. | |
| 2007/0206822 A1 | 9/2007 | Whitwell et al. | |
| 2007/0290609 A1 | 12/2007 | Ishii et al. | |
| 2009/0034174 A1 | 2/2009 | Ko et al. | |
| 2009/0034759 A1 | 2/2009 | Ko et al. | |

(56) References Cited

U.S. PATENT DOCUMENTS

| | | |
|---|---|---|
| 2009/0097692 A1 | 4/2009 | Sakamoto |
| 2009/0141926 A1 | 6/2009 | Clair et al. |
| 2009/0247237 A1 | 10/2009 | Mittleman et al. |
| 2009/0267891 A1 | 10/2009 | Ali |
| 2010/0320819 A1 | 12/2010 | Cohen et al. |
| 2011/0211719 A1 | 9/2011 | Okumura |
| 2011/0248935 A1 | 10/2011 | Mellow et al. |
| 2012/0034541 A1 | 2/2012 | Muraoka et al. |
| 2012/0242592 A1 | 9/2012 | Rothkopf et al. |
| 2012/0243719 A1 | 9/2012 | Franklin et al. |
| 2012/0274570 A1 | 11/2012 | Kim |
| 2013/0077810 A1 | 3/2013 | Mellow et al. |
| 2013/0089231 A1 | 4/2013 | Wilk et al. |
| 2013/0106868 A1 | 5/2013 | Shenoy |
| 2013/0250169 A1 | 9/2013 | Kim |
| 2013/0335210 A1* | 12/2013 | Arai ............... G06F 3/016 340/407.2 |
| 2013/0335211 A1* | 12/2013 | Kobayashi ........ G06F 1/1626 340/407.2 |
| 2014/0029777 A1 | 1/2014 | Jang |
| 2014/0049522 A1 | 2/2014 | Mathew et al. |
| 2014/0145836 A1* | 5/2014 | Tossavainen ......... G06F 3/016 340/407.2 |
| 2014/0146093 A1 | 5/2014 | Sako et al. |
| 2014/0197380 A1 | 7/2014 | Sung et al. |
| 2014/0241558 A1 | 8/2014 | Yliaho et al. |
| 2014/0241564 A1 | 8/2014 | Kang et al. |
| 2014/0326402 A1 | 11/2014 | Lee et al. |
| 2014/0334078 A1 | 11/2014 | Lee et al. |
| 2015/0010187 A1* | 1/2015 | Lee ............... H04R 1/028 381/333 |
| 2015/0016658 A1 | 1/2015 | Lee |
| 2015/0062101 A1 | 3/2015 | Kim et al. |
| 2015/0078604 A1 | 3/2015 | Seo et al. |
| 2015/0119834 A1 | 4/2015 | Locke et al. |
| 2015/0138157 A1 | 5/2015 | Harris et al. |
| 2015/0195630 A1 | 7/2015 | Yliaho et al. |
| 2015/0341714 A1 | 11/2015 | Ahn et al. |
| 2015/0350775 A1 | 12/2015 | Behles et al. |
| 2016/0011442 A1 | 1/2016 | Lee et al. |
| 2016/0050472 A1 | 2/2016 | Lee et al. |
| 2016/0079337 A1 | 3/2016 | Mathew et al. |
| 2016/0165327 A1 | 6/2016 | Crosby et al. |
| 2016/0182987 A1* | 6/2016 | Lewis ............... H04R 1/04 381/111 |
| 2016/0212513 A1 | 7/2016 | Honda et al. |
| 2016/0261966 A1 | 9/2016 | Won |
| 2016/0345102 A1 | 11/2016 | Tagami et al. |
| 2017/0070811 A1 | 3/2017 | Mihelich et al. |
| 2017/0280216 A1 | 9/2017 | Lee et al. |

FOREIGN PATENT DOCUMENTS

| | | |
|---|---|---|
| CN | 1900748 A | 1/2007 |
| CN | 1930910 A | 3/2007 |
| CN | 102946577 A | 2/2013 |
| CN | 203416417 U | 1/2014 |
| CN | 103594485 A | 2/2014 |
| CN | 203482271 U | 3/2014 |
| CN | 104143292 A | 11/2014 |
| CN | 105096778 A | 11/2015 |
| CN | 107561753 A | 1/2018 |
| CN | 206993387 U | 2/2018 |
| EP | 1 507 438 A2 | 2/2005 |
| EP | 1881731 A1 | 1/2008 |
| EP | 2894838 A1 | 7/2015 |
| EP | 2947857 A2 | 11/2015 |
| JP | 55-25284 A | 2/1980 |
| JP | H02-001987 U | 1/1990 |
| JP | H03-132296 A | 6/1991 |
| JP | 2696801 B2 | 1/1998 |
| JP | H11-44891 A | 2/1999 |
| JP | 2001-61194 A | 3/2001 |
| JP | 2002-511681 A | 4/2002 |
| JP | 2002-264646 A | 9/2002 |
| JP | 2003-211087 A | 7/2003 |
| JP | 3578244 B2 | 10/2004 |
| JP | 2004-343362 A | 12/2004 |
| JP | 2005-175553 A | 6/2005 |
| JP | 2005-244804 A | 9/2005 |
| JP | 2006-138149 A | 6/2006 |
| JP | 2006-186590 A | 7/2006 |
| JP | 2006279284 A | 10/2006 |
| JP | 2006-319626 A | 11/2006 |
| JP | 2006-325079 A | 11/2006 |
| JP | 3896675 B2 | 3/2007 |
| JP | 2007-267302 A | 10/2007 |
| JP | 2007-528648 A | 10/2007 |
| JP | 2007-300578 A | 11/2007 |
| JP | 2009-100223 A | 5/2009 |
| JP | 2009100223 A | 5/2009 |
| JP | 2009214060 A | 9/2009 |
| JP | 2009-302924 A | 12/2009 |
| JP | 2010-027845 A | 2/2010 |
| JP | 2010-081142 A | 4/2010 |
| JP | 4449605 B2 | 4/2010 |
| JP | 2011-123696 A | 6/2011 |
| JP | 2012-129247 A | 7/2012 |
| JP | 2012-198407 A | 10/2012 |
| JP | 5060443 B2 | 10/2012 |
| JP | 2013-044912 A | 3/2013 |
| JP | 2013-102360 A | 5/2013 |
| JP | 2014-509028 A | 4/2014 |
| JP | 2014-220237 A | 11/2014 |
| JP | 2014-220802 A | 11/2014 |
| JP | 2015-219528 A | 12/2015 |
| KR | 10-2008-0002228 A | 1/2008 |
| KR | 2008-0063698 A | 7/2008 |
| KR | 10-1026987 B1 | 4/2011 |
| KR | 10-1061519 B1 | 9/2011 |
| KR | 10-1404119 B1 | 6/2014 |
| KR | 101410393 B2 | 6/2014 |
| KR | 2015-0005089 A | 1/2015 |
| KR | 10-2015-0031641 A | 3/2015 |
| KR | 10-1499514 B1 | 3/2015 |
| KR | 10-2015-013128 A | 11/2015 |
| KR | 10-2015-0131428 A | 11/2015 |
| KR | 2015-133918 A | 12/2015 |
| KR | 10-2017-0135673 A | 12/2017 |
| TW | 200706049 A | 2/2007 |
| TW | M451766 U | 4/2013 |
| TW | 201319783 A | 5/2013 |
| TW | 201503710 A | 1/2015 |
| TW | 201545559 A | 12/2015 |
| WO | 99/52322 A1 | 10/1999 |
| WO | 2005089014 A1 | 9/2005 |
| WO | 2009-017280 A1 | 2/2009 |
| WO | 2012/129247 A2 | 9/2012 |
| WO | 2015-046288 A1 | 4/2015 |
| WO | 2016/002230 A1 | 1/2016 |

OTHER PUBLICATIONS

Office Action dated Sep. 26, 2017 from the Japanese Patent Office in related Japanese application No. 2016-190615.
Office Action dated Oct. 3, 2017 from the Japanese Patent Office in related Japanese application No. 2016-235794.
Communication dated Sep. 19, 2017 from the European Patent Office in related European application No. 16181185.6.
Communication dated Sep. 5, 2017 from the European Patent Office in related European application No. 16181191.4.
Communication dated Jun. 30, 2017 from the European Patent Office in counterpart European application No. 16181195.5.
Extended European Search Report issued in European Application No. 17183078.9 dated Jan. 16, 2018.
Extended European Search Report issued in European Application No. 17184428.5 dated Jan. 23, 2018.
Extended European Search Report issued in European Application No. 17184429.3 dated Jan. 26, 2018.
Japanese Office Action issued in Japanese Application No. 2016-216426 dated Nov. 24, 2017.

(56) References Cited

OTHER PUBLICATIONS

Taiwanese Office Action issued in Taiwanese Application No. 10720014270 dated Jan. 10, 2018.
Taiwanese Office Action issued in Taiwanese Application No. 10621325350 dated Jan. 3, 2018.
Japanese Office Action dated Aug. 23, 2018, issued in Japanese Application No. 2017-137757.
Japanese Office Action dated Aug. 23, 2018, issued in Japanese Application No. 2017-124022.
Japanese Office Action dated Sep. 25, 2018, issued in Japanese Application No. 2017-131143.
Office Action dated May 31, 2017, from the Taiwanese Patent Office in related Application No. 106121605.
Taiwanese Office Action dated May 15, 2018, issued in Taiwanese Application No. 106122586.
Japanese Office Action dated Jul. 3, 2018, issued in Japanese Application No. 2016-235794.
Japanese Office Action dated Jun. 5, 2018, issued in Japanese Application No. 2017-131154.
USPTO Office Action dated Sep. 8, 2017 in related U.S. Appl. No. 15/374,566.
USPTO Office Action dated Oct. 26, 2017 in related U.S. Appl. No. 15/471,458.
USPTO Office Action dated Nov. 9, 2017 in related U.S. Appl. No. 15/471,173.
USPTO Office Action dated Aug. 10, 2017 in related U.S. Appl. No. 15/340,709.
USPTO Office Action dated Oct. 13, 2017 in related U.S. Appl. No. 15/471,184.
Hermida, Alfred, "PC Screen Turns Into Speaker," BBC News, Technology, Mar. 31, 2003, pp. 1-2.
Non-final Office Action issued in U.S. Appl. No. 16/038,075 dated Jan. 18, 2019.
Final Office Action issued in U.S. Appl. No. 15/987,267 dated Dec. 13, 2018.
Office Action issued in Japanese Patent Application No. 2017-131154 dated Dec. 11, 2018.
Shim, Samsung claims double sided LCD, EDN, Jan. 2007.
Final Office Action from the U.S. Patent and Trademark Office issued in U.S. Appl. No. 16/038,075 dated May 14, 2019.
Office Action dated Mar. 20, 2019, from the Chinese Patent Office in counterpart Application No. 201710599021.3. Note: CN 105096778 A cited therein is already of record.
Office Action dated May 7, 2019, from the Chinese Patent Office in counterpart Application No. 201710368161.X. Note: CN 105096778 A cited therein is already of record.
Office Action dated Apr. 9, 2019, from the Japanese Patent Office in counterpart Application No. 2017-124022.
Chinese Office Action dated Jun. 4, 2019, issued in Chinese Application No. 201610827445.6.
Examination Report dated Jun. 16, 2020, issued in counterpart European Patent Application No. 16181191.4.

\* cited by examiner

ORGANIC LIGHT EMITTING DISPLAY DEVICE INCLUDING A SOUND GENERATING APPARATUS

CROSS REFERENCE TO RELATED APPLICATION

This is a continuation of U.S. application Ser. No. 15/388,939, filed Dec. 22, 2016, and also claims priority from Korean Patent Application No. 10-2016-0041384, filed on Apr. 5, 2016, both of which are hereby incorporated by reference for all purposes as if fully set forth herein.

BACKGROUND OF THE INVENTION

1. Field of the Invention

The present disclosure relates to an Organic Light Emitting Display (OLED) device and, more particularly, to an organic light emitting display device including a sound generating apparatus configured to directly vibrate an organic light emitting display panel to generate sound.

2. Description of the Prior Art

With the development of various portable electronic devices, such as mobile communication terminals and notebook computers, there has been an increased interest in developing flat panel display devices applicable thereto.

Such flat panel display devices include a Liquid Crystal Display Device, a Plasma Display Panel, a Field Emission Display Device, a Light Emitting Diode Display Device, and an Organic Light Emitting Diode Display Device.

Among these display devices, the Liquid Crystal Display (LCD) device includes: an array substrate including a thin film transistor; an upper substrate including a color filter and/or a black matrix; and a liquid crystal material layer formed therebetween, wherein an alignment state of the liquid crystal layer is controlled according to an electric field applied between opposite electrodes of a pixel area, and thereby the transmittance of light is adjusted to display an image.

In a display panel of such a liquid crystal display device, an Active Area (AA) configured to provide an image to a user and a Non-active Area (NA), which is a peripheral area of the Active Area (AA), are defined. The display panel is usually manufactured by attaching a first substrate, which is an array substrate having a thin film transistor formed therein to define a pixel area, and a second substrate, which is an upper substrate having a black matrix and/or color filter layer formed thereon, to each other.

The array substrate or first substrate, on which a thin film transistor is formed, includes a plurality of gate lines GS extending in a first direction and a plurality of data lines DL extending in a second direction perpendicular to the first direction, and one pixel area P is defined by each gate line and each data line. One or more thin film transistors are formed in one pixel area P, and gate and source electrodes of each thin film transistor may be connected to a gate line and a data line, respectively.

Among the above-mentioned display devices, the liquid crystal display device does not have its own light-emitting element and thus needs a separate light source. Therefore, the liquid crystal display device has a back-light unit having a light source, such as an LED, which is arranged at the rear surface thereof and irradiates a light toward a front surface of the liquid crystal panel thereof, thereby projecting a recognizable image.

Meanwhile, the organic light emitting display device has recently been in the spotlight as a display device, because the organic light emitting display device has a fast response rate, high light emitting efficiency, high luminance and a wide viewing angle, which are advantages associated with the organic light emitting display device, because the Organic Light Emitting Diode (OLED) self-emitting element.

Nom Therefore, the organic light emitting display device does not require a back-light, which is used in a liquid crystal display device using a non-light-emitting element. Thus, the OLED can be made lighter and thinner than a liquid crystal display devices. Further, the organic light emitting display device has an excellent viewing angle and an excellent contrast ratio and is advantageous in view of the power consumption, in comparison with the liquid crystal display device. Moreover, the organic light emitting display device can be driven by a low voltage direct current, has a rapid response speed, and includes solid internal components. Therefore, the organic light emitting display device is not damages by an external impact, can be used in a wide temperature range, and requires a low manufacturing cost.

In displaying an image, the organic light emitting display device uses a top emission scheme or a bottom emission scheme according to the structure of the organic light emitting display device. In the bottom emission scheme, a visible light generated in an organic light emitting layer is displayed toward the lower side of a substrate having a transistor disposed thereon. In contrast, in the top emission scheme, the visible light generated in the organic light emitting layer is displayed toward the upper side of the substrate having a transistor disposed thereon.

In such an organic light emitting display device, sub-pixels including organic light emitting diodes are arranged in a matrix form and brightness of selected sub-pixels by a scan signal, which is controlled based on the gradation of the data.

Meanwhile, a set apparatus or finished product including such a display device as described above may include, for example, a television (TV), a computer monitor, and an advertising panel.

Such a display device or set apparatus includes a sound output device, such as a speaker, for generating and outputting sound relating to an image. It is general that a company which manufactures a display device, such as a liquid crystal display device or an organic light emitting diode display device, manufactures only a display panel or display device, while another company which manufactures a speaker, assembles the speaker with the manufactured display device, so as to finally complete a set apparatus capable of outputting an image and sound. FIG. 1 is a schematic plan view of a speaker included in a conventional display device. As shown in FIG. 1, the conventional display device 1 or set apparatus includes a speaker 2 disposed at a rear or lower part of a display panel thereof.

In this structure, the sound generated by the speaker 2 does not progress toward a viewer, who is viewing an image from the front side of the display device 1, but progresses toward the rear side or the underside of the display panel. Therefore, the sound may disturb the viewer's immersive experience.

Further, when the sound generated from the speaker 2 progresses toward the rear side or underside of the display panel, the sound quality may be degraded due to interference with sound reflected by a wall or floor.

Also, the sound generated by a speaker included in the conventional display device is not oriented toward a viewer of the display device and may thus undergo diffraction, which degrades sound localization. Moreover, in configuring a set apparatus, such as a TV, a speaker may occupy a predetermined space, which imposes a restriction on the design and spatial arrangement of the set apparatus.

Therefore, there has been an increasing interest in developing technology which can improve the quality of sound output from a display device and prevent disturbance of the viewer's immersive experience.

SUMMARY OF THE INVENTION

The present disclosure has been made to overcome the above-mentioned problems associated with conventional technology and, in one aspect, provides a panel vibration type sound generating display device, which can generate sound by directly vibrating a display panel of the display device.

In another aspect, the present disclosure provides a display device using an organic light emitting display panel, in which the display panel is directly vibrated to generate sound without degrading the image output characteristic, and allows for easy arrangement of the sound generating actuator.

In another aspect, the present disclosure provides an organic light emitting display device, which directly vibrates a bottom emission type organic light emitting display panel to generate sound. Such vibrations have a lesser influence in bottom emission type devices compared to top emission type devices.

In another aspect, the present disclosure provides an organic light emitting display device including a panel vibration type sound generating apparatus, which has a support hole formed through a support part of the organic light emitting display device and a sound generating actuator inserted in and fixed to the support hole, so that the display device has a smaller thickness while having an excellent sound generation performance. The support part may also be termed a support member or support structure.

In another aspect, the present disclosure provides an organic light emitting display device, which includes a sound generating baffle part coupled to the organic light emitting display panel and a support structure thereof, which forms an air gap for transferring of sound at an edge of a predetermined area including a sound generating actuator.

In view of the above aspects, an organic light emitting display device according to an embodiment of the present disclosure may include: an organic light emitting display panel including a light emitting layer including an organic light emitting material layer and an encapsulation layer disposed at one side of the light emitting layer; and a sound generating actuator in direct contact with the organic light emitting display panel to vibrate the organic light emitting display panel to generate sound.

The organic light emitting display panel according to an exemplary aspect is a bottom emission type organic light emitting display panel in which light of the organic light emitting material layer is emitted through the substrate. Further, a surface through which light of the organic light emitting display panel is emitted, which is an image displaying plane, the light emitting layer and the encapsulation layer may be sequentially laminated under the image displaying plane, and the sound generating actuator may be disposed to be in contact with the encapsulation layer.

In another exemplary aspect, the encapsulation layer in contact with the sound generating actuator may be a metal thin film layer having a thickness of 0.05 to 0.2 mm.

In another exemplary aspect, the light emitting layer of the organic light emitting display panel may employ an R-G-B organic light emitting material layer configured to output lights of red, green, and blue light, respectively, without a separate color filter, or may include a white organic light emitting material layer and a color filter layer disposed on the white organic light emitting material layer.

The display device may further include a support part, such as a cover bottom, configured to cover and support at least a rear surface of the organic light emitting display panel, wherein the sound generating actuator is inserted in and fixed to a support hole formed at the cover bottom.

The sound generating actuator may include: a plate inserted in the support hole; a magnet disposed on the plate; a center pole disposed at a center of the plate; a bobbin disposed to surround the center pole and be in contact with the display panel; and a coil wound around the bobbin. The plate may be a lower plate, for example.

The lower plate of the sound generating actuator may further include an extension part extending outward, and the extension part may be fixed to the lower surface of the cover bottom through a bolt, a PEM™ nut (a swage or self-clinching nut), or an adhesive member.

An air gap may be formed between the organic light emitting display panel and the support part, and the display device may further include a baffle part including an adhesive member and a sealing part arranged between the lower surface of the display panel and the upper surface of the support member at an edge of the air gap.

An embodiment of the present disclosure as described above can provide a panel vibration type sound generating display device, which generates sound by directly vibrating a display panel.

Further, among various types of organic light emitting display panels, the organic light emitting display panel formed by simply attaching multiple layers or substrates can minimize degradation of the image output characteristic despite the direct vibration of the display panel to generate sound.

Moreover, among the top emission and bottom emission type devices, an exemplary aspect is the bottom emission type device in which the encapsulation layer having no light emitting device is in direct contact with the sound generating actuator, and thus can minimize degradation of the image quality by vibrating the light emitting device at the time the display panel is vibrated to generate sound.

Also, a support hole may be formed through a support part of the organic light emitting display device and the sound generating actuator may be inserted in and fixed to the support hole. Therefore, the organic light emitting display device may have a reduced thickness, resulting in improved sound generation.

In addition, the display device may include a sound generating baffle part coupled to the organic light emitting display panel and a support structure thereof at an edge of an air gap for transferring sound, which enhances sealing of the air gap, thereby enhancing sound output and preventing sound leakage.

In another exemplary aspect, an organic light emitting display device comprising: an organic light emitting display panel including a light emitting layer and an encapsulation layer disposed at one side of the light emitting layer, the light emitting layer including a substrate, a plurality of thin film transistors arranged on the substrate, and an organic light emitting material layer to emit light between two electrode layers disposed at one side of the thin film transistors; and a sound generating actuator disposed to be in contact with one surface of the organic light emitting display panel and configured to vibrate the organic light emitting display panel to generate sound.

The organic light emitting display panel of the organic light emitting display device may be a bottom emission type organic light emitting display panel in which light of the organic light emitting material layer is emitted through the substrate.

The light emitting layer and the encapsulation layer of the organic light emitting display device may be sequentially laminated under the image displaying plane, and the sound generating actuator may be disposed to be in contact with the encapsulation layer, such that a surface through which light of the organic light emitting display panel is emitted is designated as the image displaying plane.

The light emitting layer of the organic light emitting display device may comprise the substrate, the thin film transistors, and the organic light emitting material layer, which are sequentially arranged under the image displaying plane, and a polarization layer being further disposed on the substrate.

The support part of the organic light emitting display device may be a cover bottom, the lower plate further including an extension part extending outward, the extension part being fixed to a lower surface of the cover bottom.

The sealing member of the organic light emitting display device may have a thickness larger than the thickness of the adhesive member.

BRIEF DESCRIPTION OF THE DRAWINGS

The above and other objects, features and advantages of the present invention will be more apparent from the following detailed description taken in conjunction with the accompanying drawings, in which:

FIG. 2A is a plan view, and FIGS. 2B and 2C are sectional views;

FIG. 7A illustrates a case of employing color-specific organic light emitting layers and FIG. 7B illustrates a case of using a white organic light emitting layer and a color filter layer;

DETAILED DESCRIPTION OF THE EXEMPLARY EMBODIMENTS

Figure 1:
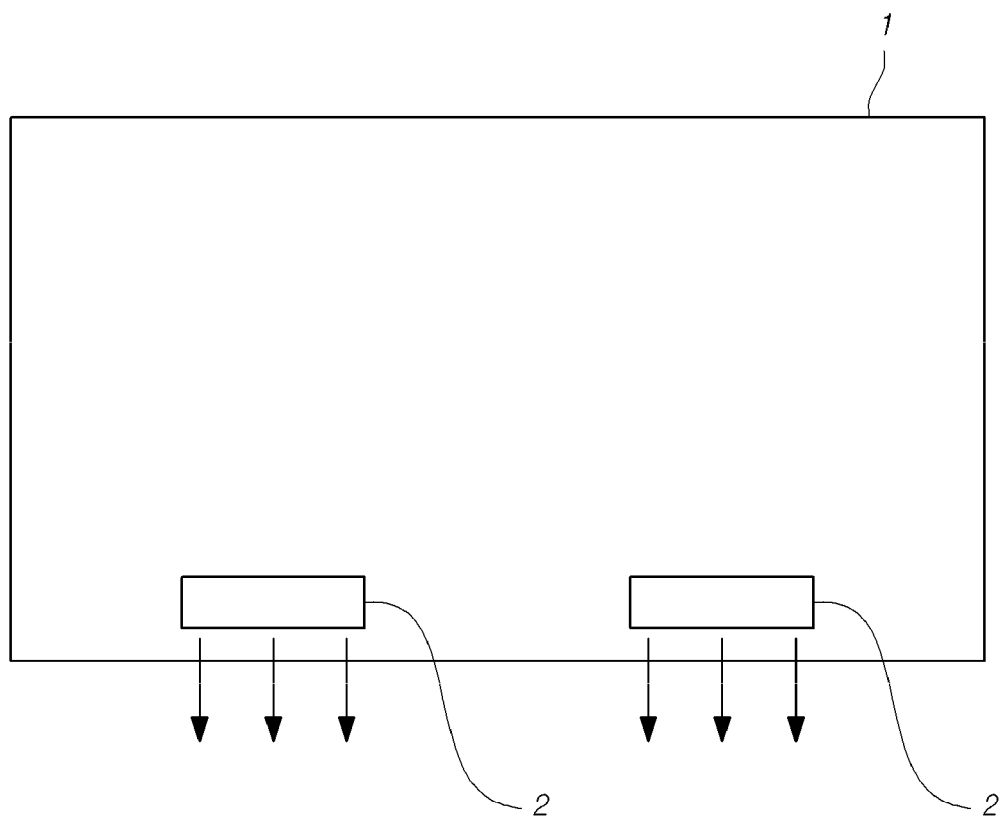
FIG. 1 is a schematic plan view of a speaker included in a conventional display device.

Hereinafter, embodiments of the present disclosure will be described with reference to the accompanying drawings. In assigning reference numerals to elements in the drawings, the same elements will be designated by the same reference numerals as far as possible although they are illustrated in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein in describing elements of the present invention. Each of these terminologies is not used to define a type, order or sequence of a corresponding component but used merely to distinguish the corresponding component from other component(s). In the case that it is described that a certain element "is connected to", "is coupled to", or "is connected with" another element, it should be understood that not only can the certain element be directly connected or coupled to the another element, but an additional element may also be "interposed" between the elements or the elements may be connected or coupled to each other through an additional element.

Figure 2A:
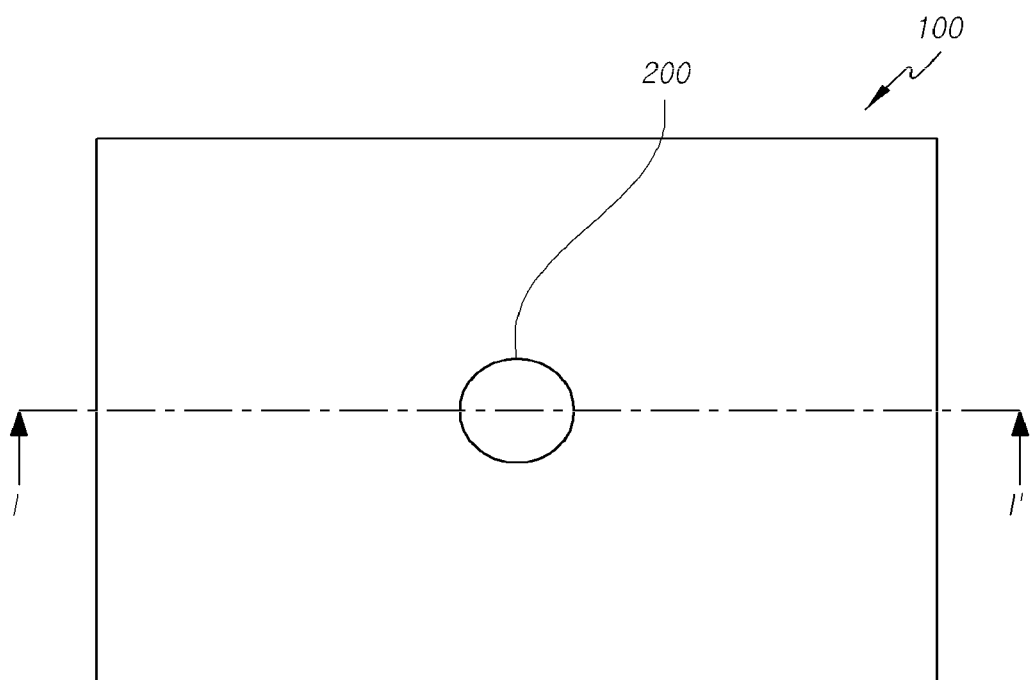
FIGS. 2A to 2C are schematic views of a display device including a panel vibration type sound generating apparatus according to an embodiment of the present disclosure, where
Figure 2B:
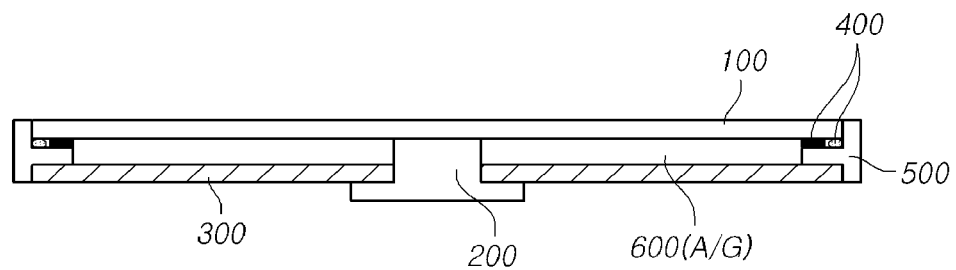
Figure 2C:
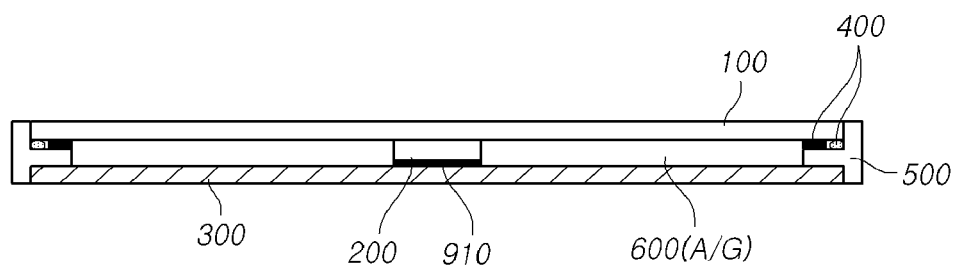

FIGS. 2A to 2C are schematic views of a display device including a panel vibration type sound generating apparatus according to an embodiment of the present disclosure, wherein FIG. 2A is a plan view and FIGS. 2B and 2C are sectional views.

As shown in FIGS. 2A to 2C, a display device according to this embodiment includes a display panel 100 configured to display an image, and a sound generating actuator 200 which is attached to a surface of the display panel and vibrates the display panel to generate sound.

A display device according to another exemplary embodiment of the present disclosure, which is described below in more detail with reference to FIGS. 4 to 7B, is a device having a sound generating actuator 200 attached to a display panel 100 to directly vibrate the display panel 100 and thereby generate sound. In this configuration, an organic light emitting display panel is used as the display panel 100.

The display panel 100 is a display panel directly vibrated by the sound generating actuator 200 to generate sound, and includes, in principle, all types of display panels including a liquid crystal display panel, an Organic Light Emitting Diode (OLED) display panel, and a Plasma Display Panel (PDP), and is not limited to a specific display panel, as long as the display panel is directly vibrated by the sound generating actuator 200 to generate sound wave.

However, when the display panel is a liquid crystal display panel, the display panel has many laminated layers and requires an indirect light source, such as a back-light having a separate light source disposed therein. Therefore, it is difficult to install the sound generating actuator 200. Moreover, when the liquid crystal display panel is directly vibrated, the directivity of the liquid crystal material may be shaken, thereby causing distortion of an image.

In contrast, an organic light emitting element is a self light-emitting element, and does not require a separate light source. Instead, the organic light emitting element has one panel in which multiple layers including a polarization layer, a glass substrate, and an encapsulation layer are integrated. Therefore, even when the OLED display panel is directly vibrated by the sound generating actuator 200, the vibration has very little effect on the light emitting property of the organic light emitting layer and thus does not cause any image distortion.

In another exemplary embodiment, a display device includes the organic light emitting display panel 100 as a display panel, which is described below in detail with reference to FIGS. 3A to 5.

Especially, in a top emission type organic light emitting display panel light is emitted toward a Thin Film Transistor (TFT) disposed on a glass substrate of a light emitting panel layer, unlike in the bottom emission organic light emitting display panel, in which the light is emitted in a opposite direction thereof.

Among the above-discussed top emission and bottom emission type devices, a display panel of the present embodiment employs the bottom emission scheme, which can reduce the degradation of the screen quality by the direct vibration of the panel and can also reduce the thickness and weight of the entire panel to enable the panel to have an excellent sound generating characteristic by vibration, which is described below in detail with reference to FIGS. 6 to 8.

Figure 3A:
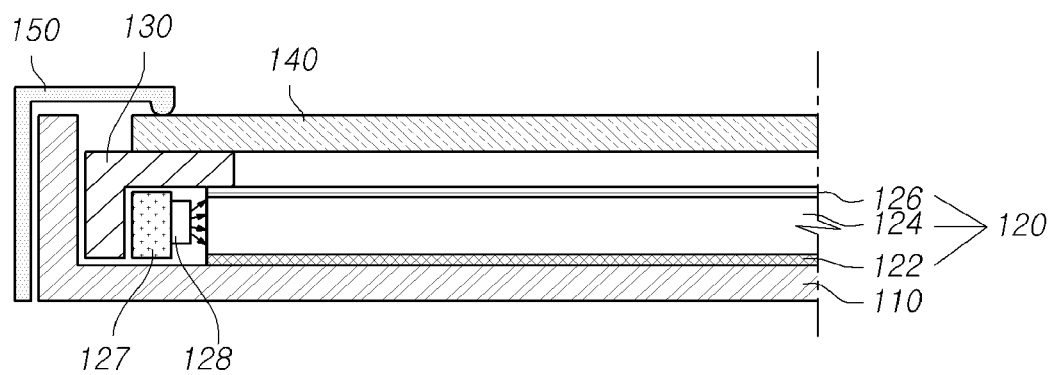
FIGS. 3A and 3B are sectional views of a liquid crystal display device including a backlight unit.
Figure 3B:
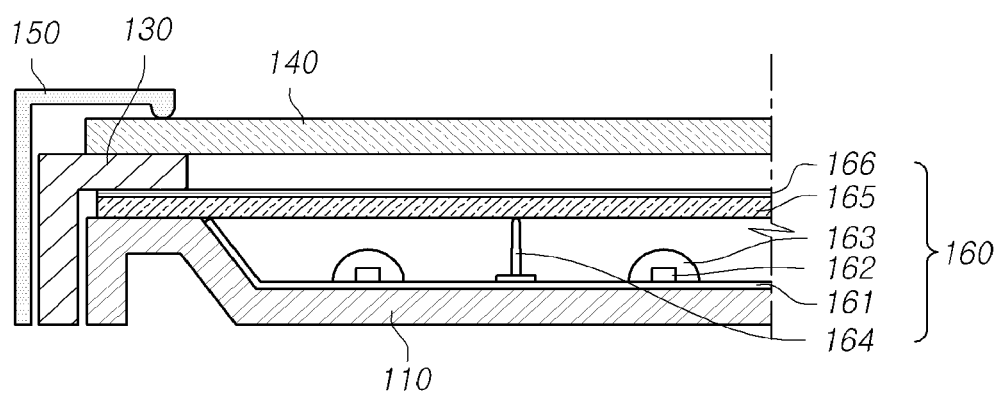
Figure 4:
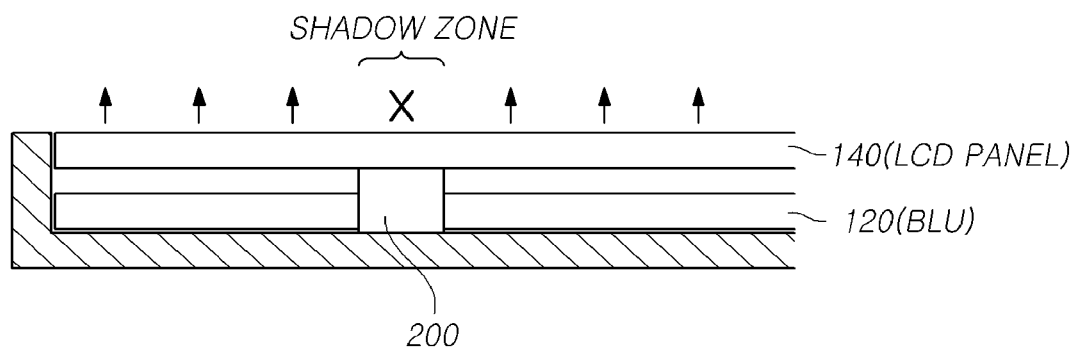
FIG. 4 illustrates a sound generating actuator according to an embodiment of the present disclosure, which is installed in a liquid crystal display device.

FIGS. 3A and 3B are sectional views of liquid crystal display devices each including a backlight unit, where an edge type backlight unit is used in FIG. 3A and a direct type backlight unit is used in FIG. 3B. FIG. 4 illustrates a liquid crystal display device in which a sound generating actuator according to an embodiment of the present disclosure is installed.

The liquid crystal display device shown in FIGS. 3A and 3B includes: a liquid crystal display panel 140; a back light unit 120 or 160 disposed thereunder to irradiate light onto the display panel 140; and a cover bottom 110, which supports the back light unit, extends over the entirety of the rear surface of the display device, and may be made of metal or plastic.

The liquid crystal display device may further include: a guide panel 130 configured to support a light source housing 127 of the backlight unit at one side surface thereof and the display panel 140 at the top thereof; and a case top 150 configured to surround a side surface of the cover bottom or guide panel and extend to a part of the front surface of the display panel.

The liquid crystal display device described above includes a backlight unit for providing light to the display panel, and the backlight unit may be divided into an edge type backlight unit and a direct type backlight unit according to the arrangement of the light source and the type of light transfer.

The edge-type backlight unit 120 as shown in FIG. 3A may include: a light source 128, such as an LED, and a light source housing 127, which are arranged at one side of the display device, the light source housing including a holder configured to fix the light source, a light source driving circuit, etc.; a Light Guide Plate (LGP) 124 configured to diffuse light to the entire panel area; a reflection plate 122 configured to reflect light toward the display panel; and at least one optical sheet 126 disposed on the light guide plate to improve luminance, diffuse the light, and protect the light guide plate.

In the edge-type backlight unit, light from the light source enters, is spread over the entire surface of the display device through total reflection thereof by the light guide plate, and then exits toward the display panel.

As shown in FIG. 3B, the direct type backlight unit 160 may include a light source PCB 161 disposed on a cover bottom 110, a diffusion plate 165 disposed above and spaced a predetermined distance apart from the light source PCB to diffuse the light, at least one optical sheet 166 disposed on the diffusion plate, and a plurality of Diffusion Plate Supports (DPSs) 164 arranged on the light source PCB 161 to prevent a deflection of the diffusion plate.

The light source PCB 161 is disposed on the entire surface of the display device, and a plurality of LED chips 162, which are light sources, and light diffusion lenses 163 configured to diffuse light from the light sources are arranged on the light source PCB.

The liquid crystal display panel 140 used in the liquid crystal display device includes: a plurality of gate lines; a plurality of data lines; pixels defined at intersecting areas between the gate lines and data lines; an array substrate including a thin-film transistor, which is a switching device configured to adjust a light transmission degree at each pixel; an upper substrate including a color filter and/or a black matrix; and a liquid crystal material layer disposed between a pixel electrode and a common electrode.

In the liquid crystal display panel, when a predetermined electric field is established between the pixel electrode and the common electrode by a switching of a thin film transistor, the liquid crystal material layer has a changed transmittance based on a predetermined alignment characteristic based on the electric field.

Therefore, as shown in FIG. 4, when the liquid crystal display panel is directly vibrated by a sound generating actuator, the alignment of the liquid crystal material may be altered to change the transmittance of the pixels, thereby distorting an image.

Further, as shown in FIG. 4, when a liquid crystal display device has a sound generating actuator 200 mounted therein, the sound generating actuator may extend through or be installed on a part of the backlight unit 120.

As a result, the light may not be transferred to a pixel or pixels arranged above the area through or on which the sound generating actuator is disposed, thereby generating a corresponding shadow zone.

Therefore, in a display device according to an embodiment of the present disclosure, the display panel to which the sound generating actuator is directly attached is limited to an organic light emitting display panel.

Figure 5:
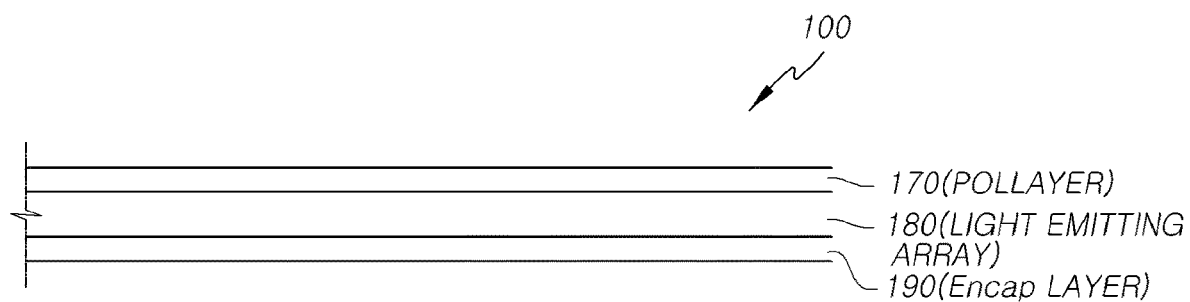
FIG. 5 is a cross-sectional view of an organic light emitting display panel used in a display device according to an embodiment of the present disclosure.

FIG. 5 is a cross-sectional view of an organic light emitting display panel used in a display device according to an embodiment of the present disclosure.

As shown in FIGS. 2A to 2C, an organic light emitting display device according to an embodiment of the present disclosure includes, in a large part, an organic light emitting display panel 100 and a sound generating actuator 200 which is attached to a surface of the organic light emitting display panel 100 and vibrates the organic light emitting display panel 100 to generate sound.

The organic light emitting display panel according to the present embodiment may be divided into a top emission type panel and a bottom emission type panel according to the direction in which the light from the organic light emitting material layer progresses.

In brief, in the top emission type organic light emitting display panel, the light generated in the organic light emitting material layer progresses upward, which is opposite to the substrate of the light emitting layer, and one surface, which is opposite to the substrate, serves as an image displaying plane.

In contrast, in the bottom emission type organic light emitting display panel, the light generated in the organic light emitting material layer progresses toward the substrate of the light emitting layer and is emitted through the substrate, and the outer surface the substrate of the light emitting layer serves as an image displaying plane.

In embodiments of the present disclosure, it may be more advantageous to use the bottom emission type organic light emitting display panel, which is described hereinafter in detail with reference to FIGS. 6 to 8.

Figure 6:
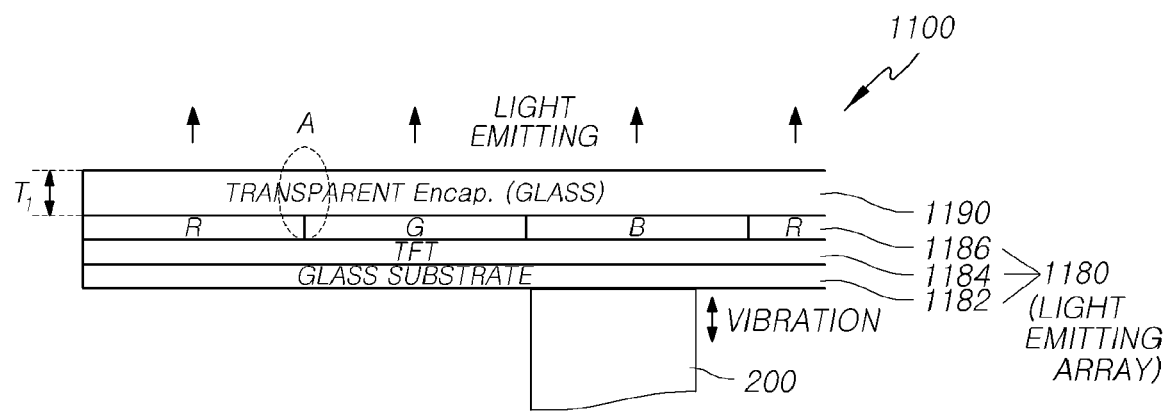
FIG. 6 is a sectional view of a top emission type organic light emitting display panel in which light is emitted toward a Thin Film Transistor (TFT) with reference to a substrate of a light emitting layer thereof.

FIG. 6 is a sectional view of a top emission type organic light emitting display panel in which light is emitted toward a Thin Film Transistor (TFT) and away from a substrate of the light emitting layer thereof.

As shown in FIG. 6, the top emission type organic light emitting display panel 1100 may include a light emitting layer 1180 and an encapsulation layer 1190 disposed at one side of the light emitting layer to protect the light emitting layer.

The light emitting layer 1180 is an array including a self-emissive organic light emitting material layer, and is formed by sequentially laminating a glass substrate 1182, a TFT layer 1184 including a plurality of TFTs arranged on the glass substrate 1182; and an organic light emitting material layer 1186 disposed at one side of the TFT layer.

Although not illustrated, a first electrode (anode or cathode) and a second electrode (cathode or anode), which are connected to a source or drain electrode of a TFT, are also included, and the organic light emitting material layer is disposed between the two electrode layers.

According to an electric potential difference generated between the two electrodes by a switching operation of the TFT, the organic light emitting device emits light through self-emission.

From among the two side surfaces of the light emitting layer, the side at which the glass substrate is disposed is protected by the glass substrate from introduction of external moisture or alien materials. However, the side opposite to the glass substrate, that is, the side at which the organic light emitting display layer is disposed, needs to be protected from external moisture or alien materials, which may be introduced thereinto.

The encapsulation layer 1190 is a protective layer used for this purpose, and is attached to the upper surface of the organic light emitting material layer of the light emitting layer to prevent the organic light emitting device from being damaged.

In the present specification, the encapsulation layer is not limited, and should be construed to include all types of protective layers which can protect an organic light emitting material layer of a light emitting layer of an organic light emitting display panel, and may be expressed by another term, such as a protective layer, a second substrate layer, etc.

In the top emission type panel as illustrated in FIG. 6, the light is emitted in a direction opposite to the glass substrate 1182 and an image displaying plane is placed in the direction of light emission, and the encapsulation layer 1190 is disposed directly on the outer surface of the organic light emitting material layer 1186.

The sound generating actuator 200 is attached to the glass substrate 1182 of the light emitting layer 1180 at an opposite side to the image displaying plane.

In the top emission type panel, the organic light emitting material layer 1186 including light emitting devices of various colors including R, G, and B is disposed directly under the image displaying plane, and two colors may be mixed when the display device is viewed in a wide viewing angle.

That is, as shown in FIG. 6, since an organic light emitting material layer of R, G, and B is disposed adjacent to the image displaying plane, a color-mixture zone A formed by mixing of two colors may be observed between the red R and the green G zones in a wide viewing angle.

Therefore, when a sound generating actuator according to an embodiment of the present disclosure is applied to the top emission type organic light emitting display panel, the vibration of the organic light emitting display panel may intensify the color mixing as described above, which may thereby degrade the screen quality.

Further, as shown in FIG. 6, in the top emission type panel, the encapsulation layer 1190 is disposed at the side of the image displaying plane. Therefore, a transparent encapsulation layer 1190 is required, and may be made of a glass material, and the like.

Also, in the top emission type panel, the encapsulation layer 1190 serves as the image displaying plane exposed to a viewer and is thus required to have at least a predetermined strength to be robust against an external impact, etc.

Therefore, in the top emission type panel, the encapsulation layer 1190 may be formed as a glass layer having a first thickness T1, which is relatively thick. In a large TV, etc., the first thickness T1 of the encapsulation layer 1190 is required to have a value of at least about 1 mm.

In an embodiment of the present disclosure, a sound generating actuator uses a display panel as a vibration plate and directly vibrates the display panel to generate sound. Therefore, when the display panel is thick or heavy, it is difficult for the actuator to vibrate the display panel, which may hinder sound generation, or reduce the magnitude of the output sound.

In consideration of such disadvantages of the top emission type organic light emitting display panel, an embodiment of the present disclosure uses a bottom emission type organic light emitting display panel, which is described below in detail.

Figure 7A:
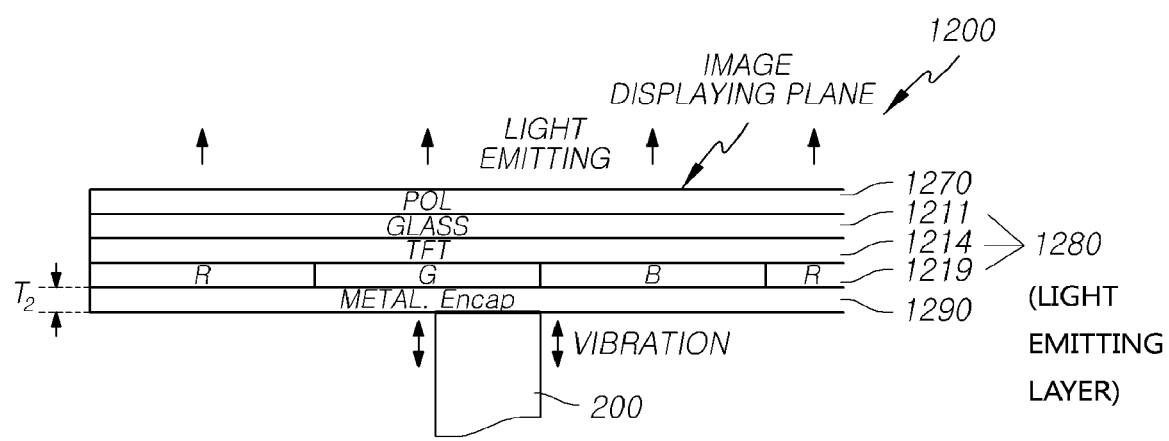
FIGS. 7A and 7B are sectional views of a bottom emission type organic light emitting display panel applicable to a display device according to an embodiment of the present disclosure, where
Figure 7B:
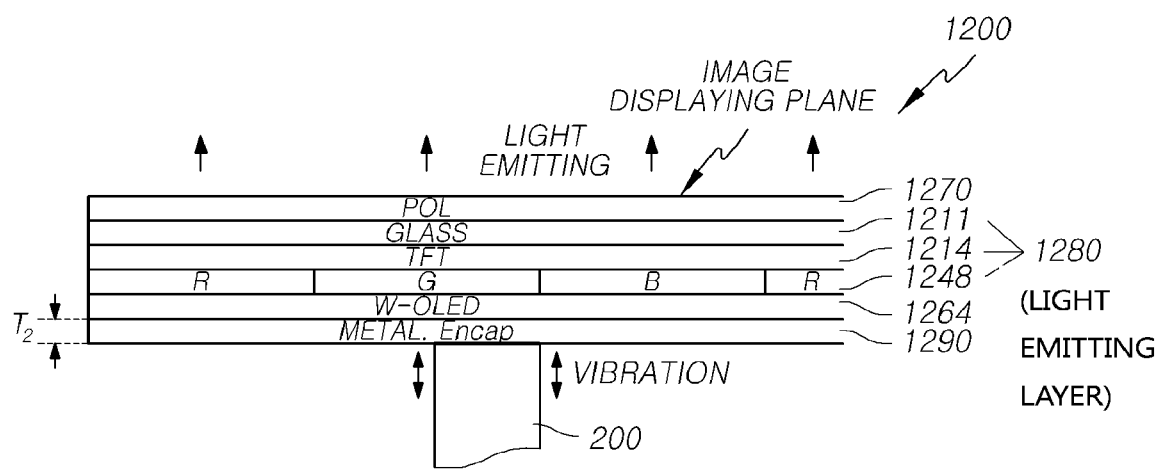

FIGS. 7A and 7B are sectional views of a bottom emission type organic light emitting display panel applicable to a display device according to an embodiment of the present disclosure. FIG. 7A illustrates an exemplary display panel that includes color-specific glass light emitting layers and FIG. 7B illustrates an exemplary display panel that includes a White Organic Light Emitting Device (WOLED) layer and a color filter layer. The following description discusses FIG. 7A as a representative example.

FIG. 7A illustrates a structure in which the light emitting material layer 1219 of the light emitting layer 1280 may not include a separate color filter, but is configured by organic light emitting materials outputting lights of corresponding colors (R, G, and B), respectively, and FIG. 7B illustrates a structure in which the organic light emitting material layer is a white light emitting material layer 1264 is configured to emit a white light and a color filter layer 1248 is disposed on the white organic light emitting material layer.

Further, as shown in FIGS. 7A and 7B, the organic light emitting display panel 1200 of the organic light emitting display device according to an embodiment of the present disclosure may include an encapsulation layer 1290 to which a sound generating actuator 200 is attached, a light emitting layer 1280 disposed on the encapsulation layer, and a polarization layer 1270 disposed on the light emitting layer.

The light emitting layer 1280 is an array substrate including a self-emissive organic light emitting material layer, and is formed by sequentially laminating a substrate 1211 made of glass, a TFT layer 1214 including a plurality of TFTs arranged on the glass substrate 1211; and an organic light emitting material layer 1219 disposed at one side of the TFT layer.

As described in more detail with reference to FIG. 8, a first electrode (anode or cathode) and a second electrode (cathode or anode) are connected to a source or drain electrode of a TFT, and the organic light emitting material layer 1219 is disposed between the two electrode layers.

When an electric potential difference is generated between the two electrodes by a switching operation of the TFT, the organic light emitting device emits light through self-emission.

In this event, one surface of the polarization layer 1270 serves as the image displaying plane on which an image is displayed, and the polarization layer 1270, the light emitting layer 1280, and the encapsulation layer 1290 are sequentially arranged under the image displaying plane. In some cases, the polarization layer 1270 may be omitted.

In the structures shown in FIGS. 7A and 7B, light emitted from the organic light emitting material layer progresses through the thin film transistor layer 1214 and the substrate 1211. Therefore, on a premise that the substrate 1211 is at the lower side (bottom side), the illustrated panels are expressed as bottom emission type panels in which the light is emitted toward the substrate (bottom).

In the bottom emission type organic light emitting display panel 1200, the encapsulation layer 1290 is disposed adjacent to the organic light emitting material layer 1219 to protect the organic light emitting material layer 1219.

Therefore, although the encapsulation layer 1190 is disposed at the side of the image displaying plane in the top emission type panel (see e.g., FIG. 6), the encapsulation layer 1290 is disposed at the side opposite to the image displaying plane and the sound generating actuator 200 is attached to the encapsulation layer 1290 in the bottom emission type panel as shown in FIGS. 7A and 7B.

In the bottom emission type panel as shown in FIGS. 7A and 7B, since the encapsulation layer 1290 is disposed at the side opposite to the image displaying plane, the encapsulation layer 1290 may be made from a non-transparent material and not need to be rigid enough to provide protection from external impact.

That is, in the bottom emission type panel, the encapsulation layer 1290 may function only to block moisture or alien materials.

Therefore, the encapsulation layer 1290 of the organic light emitting display panel according to this embodiment may be a metal thin film having a second thickness T2 smaller than the first thickness T1 of the encapsulation layer 1190 of the top emission type panel.

In an exemplary embodiment, the second thickness of the encapsulation layer 1290 may have a value of about 0.05 to 0.2 mm.

The material of the encapsulation layer 1290 of the organic light emitting display panel is not limited to metal and may include all materials which can protect the organic light emitting material layer and can be configured as a thin film.

Further, the encapsulation layer 1290 may be made of a metal material having a predetermined reflection property or higher.

As shown in FIGS. 7A and 7B, the light emitted from the organic light emitting material layer 1219 may be output to the image displaying plane which is opposite to the encapsulation layer 1290. Therefore, when the encapsulation layer 1290 is made of a metal material having a predetermined reflection property or higher, the encapsulation layer 1290 functions as a reflection plate, which can improve the optical efficiency of the display panel.

In another exemplary embodiment, the encapsulation layer 1290 may be made of an iron-nickel alloy, a so-called Invar™ metal material, to prevent hydrogen or oxygen from entering the organic light emitting material layer 1219 and oxidizing the organic light emitting device.

The bottom emission type organic light emitting display panel according to embodiments of the present disclosure shown in FIGS. 7A and 7B has the organic light emitting material layer 1219, which is disposed away from the image displaying plane, and thus can minimize the color mixing phenomenon in a large viewing angle as described with reference to FIG. 6. The bottom emission type organic light emitting display panel is more advantageous than the top emission type organic light emitting display panel in that the former has nearly no observed color mixing phenomenon even when the display panel is vibrated to generate sound.

Further, the bottom emission type organic light emitting display panel according to exemplary embodiments of the present disclosure can reduce the thickness of the encapsulation layer, in comparison with the top emission type panel shown in FIG. 6.

By reducing the thickness and weight of the display panel to be vibrated to generate sound, the bottom emission type organic light emitting display panel allows the sound generating actuator to easily generate the vibration, has an improved sound reproduction performance, and can increase the sound output compared to a top emission type device when using the same actuator.

FIG. 7B illustrates a panel in which the organic light emitting material layer is a White Organic Light Emitting Device (WOLED) layer 1264 emitting a white light and a color filter layer 1248 disposed on the WOLED layer.

Since the optical efficiency of a white organic light emitting device is usually better than that of other color-specific organic light emitting devices, the structure shown in FIG. 7B can further improve the optical efficiency of the organic light emitting display device.

As described above, use of an organic light emitting display panel as a display panel in a display device, where the display panel is directly vibrated to generate sound facilitates the arrangement of the sound generating actuator and can prevent the sound generating actuator from degrading the screen quality.

Figure 8:
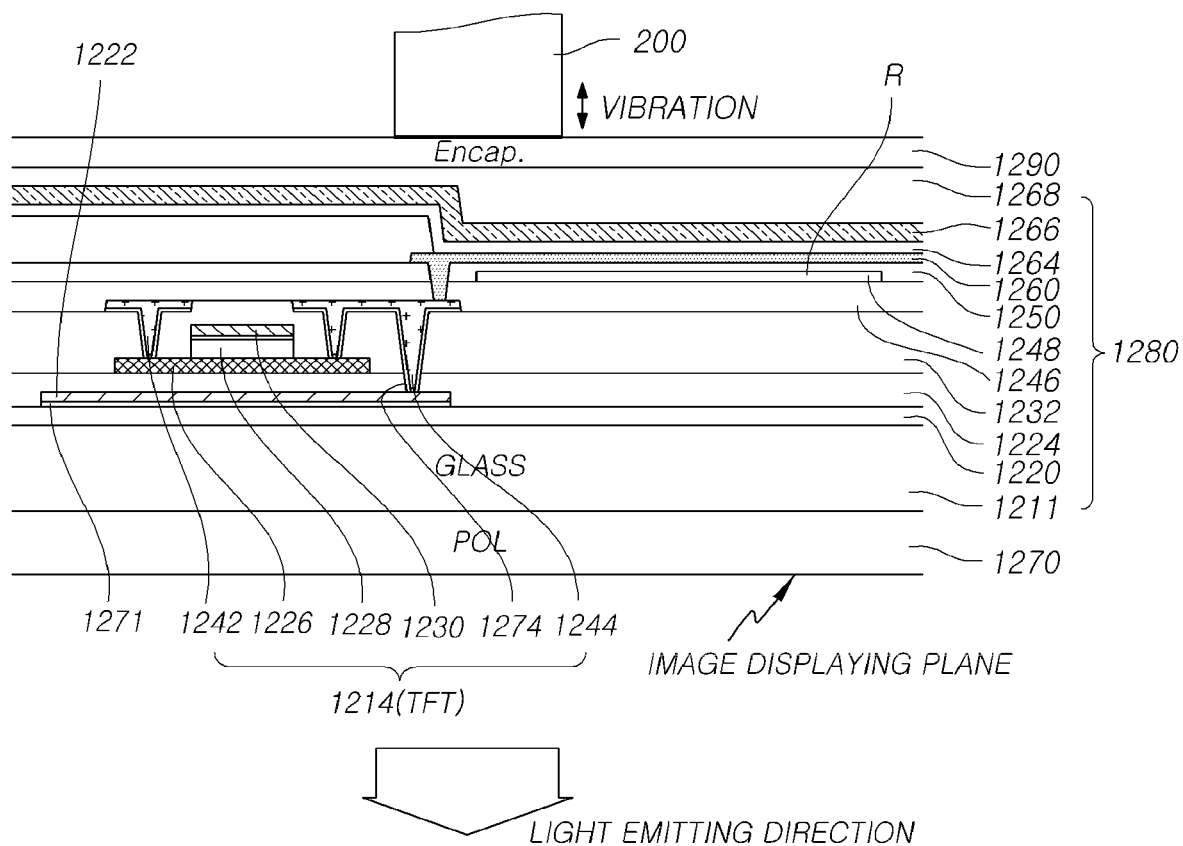
FIG. 8 is a detailed sectional view illustrating a lamination structure of a bottom emission type organic light emitting display panel according to an embodiment of the present disclosure.

FIG. 8 is a detailed sectional view illustrating a lamination structure of a bottom emission type organic light emitting display panel used in various exemplary embodiments of the present disclosure.

For convenience of description, the light emitting direction or the image displaying plane is oriented downward in FIG. 8, contrary to the orientation shown in FIG. 7.

As shown in FIG. 8, the polarization layer 1270 is disposed on the image displaying plane, a light emitting layer 1280 is laminated on and in contact with the polarization layer, an encapsulation layer 1290 is disposed on one surface of the light emitting layer 1280, and the sound generating actuator 200 is attached to the encapsulation layer 1290.

Hereinafter, elements of the light emitting layer 1280 of the bottom emission type organic light emitting display panel according to an exemplary embodiment are described in detail.

On a substrate 1211 of the light emitting layer 1280, a buffer layer 1220, a light blocking layer 1222, a first interlayer insulation film 1224, a semiconductor layer 1226, a gate insulation film 1228, a gate electrode 1230, a second interlayer insulation film 1232, a source electrode 1242, a drain electrode 1244, a third interlayer insulation film 1246, a color filter 1248, a planarization layer 1250, a first electrode 1260, a bank 1262, an organic light emitting material layer 1264, a second electrode 1266, and a passivation layer 1268 may be arranged.

The substrate 1211 of the light emitting layer 1280 may be a glass substrate without being limited thereto, and may be a plastic substrate including polyethylene terephthalate (PET), polyethylene naphthalate (PEN), and polyimide.

The buffer layer 1220 is a layer for blocking permeation of alien material into the substrate 1211 or improving the interface characteristic or the degree of flatness, and may be configured as a single layer or multiple layers made of silicon nitride (SiNx) or silicon oxide (SiOx).

The light blocking layer 1222 is a layer for blocking light incident to a channel area of the semiconductor layer 1226. To this end, the light blocking layer may be configured as a metal layer which is opaque to block the light. Further, the light blocking layer 1222 may be electrically connected to the drain electrode 1244 to prevent generation of a parasitic capacitance.

The first interlayer insulation film 1224 insulates the light blocking layer 1222 and the semiconductor layer 1226 from each other. This first interlayer insulation film 1224 includes an insulating material and may be laminated on the buffer layer 1220 and the light blocking layer 1222.

The semiconductor layer 1226 includes silicon (Si) and is disposed on the first interlayer insulation film 1224, and may include an active area establishing a channel, and a source area and a drain area, which are arranged at both sides of the active area and doped with a high concentration of impurities.

The gate insulation film 1228 insulates the semiconductor layer 1226 and the gate electrode 1230 from each other. The gate insulation film 1228 may include an insulating material and may be laminated on the semiconductor layer 1226.

The gate electrode 1230 is disposed on the gate insulation film 1228 and receives a gate voltage supplied from a gate line.

The second interlayer insulation film 1232 protects the gate electrode 1230 and insulates the gate electrode 1230, the source electrode 1242, and the drain electrode 1244 from one another. This second interlayer insulation film 1232 may include an insulating material and may be laminated on the first interlayer insulation film 1224, the semiconductor layer 1226, and the gate electrode 1230.

The source electrode 1242 and the drain electrode 1244 are disposed on the second interlayer insulation film 1232 and are in contact with the semiconductor layer 1226 through a first contact hole and a second contact hole, respectively, formed through the second interlayer insulation film 1232. The drain electrode 1244 is in contact with the light blocking layer 1222 through a third contact hole.

The source electrode 1242 and the drain electrode 1244, the semiconductor layer 1226 in contact with these electrodes, and the gate insulation film 1228 and the gate electrode 1230 disposed on the semiconductor layer 1226 may configure the thin film transistor layer 1214.

The third interlayer insulation film 1246 protects the source electrode 1242 and the drain electrode 1244.

The color filter 1248 may be disposed to overlap with the organic light emitting material layer 1264 on the second interlayer insulation film 1232 to change the color of light emitted toward the substrate 1211 in the bottom emission type panel.

The planarization layer 1250 may protect the source electrode 1242 and the drain electrode 1244 and may planarize the surface on which the first electrode 1260 is disposed.

The first electrode 1260 is disposed on the planarization layer 1250 and is in contact with the drain electrode 1244 through a fourth contact hole formed though the planarization layer 1250. The first electrode 1260 functions as an anode electrode, and has a relatively large work function value and may be made of a transparent conductive material to allow the light generated in the organic light emitting material layer 1264 to pass therethrough.

For example, the first electrode 1260 may be made from a metallic oxide such as Indium Tin Oxide (ITO) or Indium Zinc Oxide (IZO), a compound of a metal and an oxide such as ZnO:Al or SnO2:Sb, a conductive polymer such as poly(3-methylthiophen), poly[3,4-(ethylen-1,2-dioxy)thiophen] (PEDT), polypyrrole, and polyaniline, and the like. Further, the first electrode 1260 may be made of Carbon Nanotube (CNT), graphene, silver nano wire, and the like.

The organic light emitting material layer 1264 is disposed on the first electrode 1260 and may be configured as a single layer made of a light emitting material or multiple layers including a hole injection layer, a hole transfer layer, a light emitting layer, an electron transfer layer, and an electron injection layer. This organic light emitting material layer 1264 may be a white light organic light emitting material layer configured to output white light, and may be applied over the entire surface without being patterned. The organic light emitting material layer 1264 does not require a patterning process, and thus, can simplify the process and reduce cost.

The second electrode 1266 is disposed on the organic light emitting material layer 1264, is a cathode electrode (negative electrode), and may be made of a conductive material having a relatively small work function value. The second electrode 1266 may be configured as a single layer of a single metal including Ag or an alloy further including Mg at a predetermined proportion, or multiple layers thereof.

The first electrode 1260 is connected to the thin film transistor, the second electrode 1266 is disposed to face the first electrode 1260, and the organic light emitting material layer 1264 is disposed between the first electrode 1260 and the second electrode 1266, and may be collectively referred to as an organic light emitting device.

When a predetermined voltage is applied between the first electrode 1260 and the second electrode 1266, a hole injected from the first electrode 1260 and an electron provided by the second electrode 1266 are transferred to the organic light emitting material layer 1264 to create an exciton. Energy is generated when this exciton shifts from an excited state to a ground state, and the energy is emitted in the form of visible light rays.

The bank is disposed on an edge of the first electrode 1260 and may have an opening through which the first electrode 1260 is exposed. The bank may be made of an inorganic insulation material, such as SiOx, SiNx, or SiON.

The passivation layer 1268 protects the organic layer from moisture and oxygen and may have a multi-layer structure including an inorganic material, an organic material, and a mixture thereof.

Each of the light blocking layer 1222, the gate electrode 1230, the source electrode 1242, and the drain electrode 1244 may include a low reflective layer 1271 at an upper part thereof. The low reflective layer can prevent reflection of an external light to prevent degradation of visibility, a decrease in luminance, degradation of contrast range characteristic, and the like.

The low reflective layer 1271 may be formed of a material that absorbs external light introduced through the substrate 1211, or may be coated with a light absorbent. Here, the external light may refer to a non-polarized light which has not passed through a polarizing plate or a polarizing layer.

The material that absorbs external light may be formed of a metal that absorbs light, or an alloy thereof, and may have a black-based color. For example, the low reflective layer 1271 may be made of one of Mo, Cr, Ti, Nb, Mn, and Ta, or an alloy thereof. However, embodiments are not limited thereto, and may include any metal that absorbs light. Accordingly, the low reflective layer 1271 can prevent external light from being reflected again to the outside.

Further, the low reflective layer 1271 may be made of a metal oxide or an alloy of a metal absorbing light and a metal oxide, and thus can block light introduced from the outside. In a preferred embodiment, the low reflective layer 1271 may be made of a metal oxide, such as Indium Tin Oxide (ITO), Indium Zinc Oxide (IZO), or Indium Tin Zinc Oxide (ITZO). In this embodiment, external light is not reflected back to the outside because of the destructive interference between light reflected by a surface of the low reflective layer 1271 and the light that passes through the low reflective layer 1271 and is then reflected by an interface between the conductive layer and the low reflective layer 1271.

The organic light emitting display panel 1200 according to an exemplary embodiment may further include a transmittance adjustment film (not illustrated) and/or a transparent multi-layer film (not illustrated) disposed at one surface of the substrate 1211 to absorb light having a wavelength in the visible range.

The transmittance adjustment film absorbs the light entering the substrate 1211 from the outside and thus can greatly lower the reflectance of the substrate 1211 through absorption of external light with a predetermined transmittance ratio.

The transparent multi-layer film has a laminated structure including a plurality of refraction layers having different refractive ratios between adjacent layers, and removes external light by destructive interference of light reflected by refraction layers having various refractive ratios to reduce the reflectance of the external light.

The transmittance adjustment film and/or transparent multi-layer film as described above may form the polarization layer 1270 or a part thereof.

The sound generating actuator 200 according to an exemplary embodiment, which is described below in more detail with reference to FIGS. 9A and 9B, includes a magnet, a plate supporting the magnet, a center pole protruding from a central area of the plate, and a bobbin disposed to surround the center pole and having a coil wound thereon, to which an electric current for generating sound is applied, wherein a distal end of the bobbin is attached to one surface of the display panel.

Further, as shown in FIGS. 2B and 2C, the organic light emitting display device according to this embodiment may include a support part configured to support one or more of the rear surface or a side surface of the display panel, and the plate of the sound generating actuator is fixed to the support part.

The support part includes a cover bottom 300 disposed at the rear surface of the organic light emitting display panel 100, and may further include a middle cabinet 500 which is coupled to the cover bottom. The middle cabinet 500 surrounds the side surface of the organic light emitting display panel and receives and supports one side edge of the display panel.

The cover bottom of the support part may be a plate-shaped member made of metal or plastic extending over the entire rear surface of the display device.

The cover bottom 300 in the present disclosure is not limited to the term thereof but other expressions may be used to describe this feature, such as a plate bottom, a back cover, a base frame, a metal frame, a metal chassis, a chassis base, or m-chassis, and may include all types of frames or plate-shaped structures, which are arranged on the rear base part of the display device for supporting the display panel.

The organic light emitting display device according to this embodiment may further include a baffle part 400 configured to form an air gap, which is a space disposed between the organic light emitting display panel 100 and a support part, i.e., the cover bottom 300 or the middle cabinet 500, to transfer the generated sound wave.

By coupling the organic light emitting display panel to the cover bottom 300 at an edge of the air gap 600 and sealing the same, the air gap may be defined as an area sealed in all directions, and such a sealed air gap may be expressed as a baffle structure.

The baffle part 400 may include an adhesive member 412, which is disposed at an edge of the cover bottom or middle cabinet and is attached to the lower surface of the display panel, and a sealing part 414, which is disposed outside the adhesive member to reinforce the sealing of the air gap 600.

The adhesive member 412 may be a double sided tape. In an exemplary embodiment, the height of the sealing part 414 is, preferably, higher than the height of the adhesive member 412.

Figure 9A:
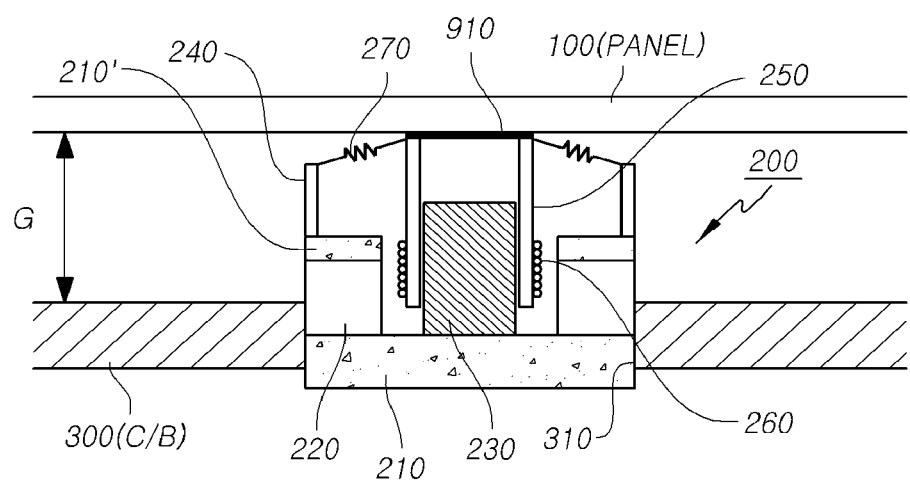
FIGS. 9A and 9B are sectional views of two types of sound generating actuators according to an embodiment of the present disclosure.
Figure 9B:
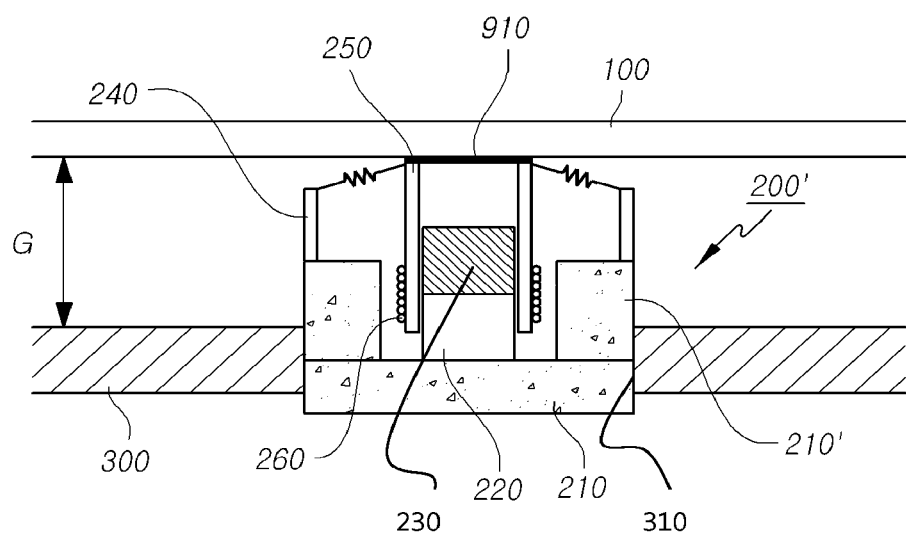

FIGS. 9A and 9B are sectional views of two types of sound generating actuators according to exemplary embodiments of the present disclosure.

A sound generating actuator 200 of an exemplary embodiment may include a magnet 220, which is a permanent magnet, plates 210 and 210' configured to support the magnet, a center pole 230 protruding from a central area of the plate 210, a bobbin 250 disposed to surround the center pole 230, and a coil 260 wound around the bobbin, where an electric current is applied to the coil 260 to generate sound.

The sound generating actuator may include a first structure in which the magnet is disposed outside the coil and a second structure in which the magnet is disposed inside the coil.

FIG. 9A illustrates the first structure where the magnet has an annular shape with the coil positioned at the center of the magnet. Thus structure may be referred to as a dynamic type or an external magnet type.

In the sound generating actuator of the first structure, the lower plate 210 is fixed to a support hole 310 formed at the cover bottom 300 and the magnet 220 is disposed outside the lower plate.

The upper plate 210' is disposed on the magnet 220, and an external frame 240 protruding from the upper plate is disposed outside the upper plate.

The center pole 230 protrudes from the central area of the lower plate 210 and the bobbin 250 surrounds the center pole 230.

The coil 260 is wound around a lower portion of the bobbin 250, and the electric current for generating sound is applied to the coil.

A damper 270 may be disposed between an upper part of the bobbin and the external frame 240.

The lower plate 210 and the upper plate 210' fix the sound generating actuator 200 to the cover bottom 300 while supporting the magnet 220. The lower plate 210 has a cylindrical shape as shown in FIG. 9A, and the magnet 220 having a ring shape is disposed on the lower plate 210, and the upper plate 210' is disposed on the magnet.

As the lower plate 210 and the upper plate 210' are coupled to the cover bottom 300, the magnet 220 disposed between the lower plate 210 and the upper plate 210' can be both fixed and supported.

The plate may be formed of a material having a magnetic property, such as a ferrite. The plate is not limited to the term thereof and may be referred to by another team, such as a yoke.

The center pole 230 and the lower plate 210 may be integrally formed.

The bobbin 250 is a cylindrical structure formed by a paper or aluminum sheet, and the coil 260 is wound around a predetermined lower area of the bobbin. A combination of the bobbin and the coil may be referred to as a voice coil.

When an electric current is applied to the coil, a magnetic field is formed around the coil. Due to an external magnetic field formed by the magnet 220, the entire bobbin moves upward while being guided by the center pole according to Fleming's Law.

Meanwhile, since the distal end of the bobbin 250 is attached to the rear surface of the organic light emitting display panel 100, the bobbin vibrates the organic light emitting display panel based on the application or non-application of the electric current, and such a vibration generates a sound wave.

An adhesive member 910 configured to attach the bobbin to the organic light emitting display panel 100 may be disposed on the distal end of the bobbin, and the adhesive member may be a double-sided adhesive tape.

Although not illustrated, in addition to the adhesive member, at least one plate may be arranged on the distal end of the bobbin, and the plate may be integrally formed with the adhesive member 910. The plate transfers the vibration based on the movement of the bobbin to the display panel.

The plate may be made of plastic or metal. In a preferred embodiment, the plate may be made of a metal material to discharge the heat generated in the bobbin and the sound generating actuator.

The magnet 220 may be a sintered magnet, such as a barium ferrite, or a cast magnet made from an alloy of ferric oxide (Fe2O3), barium carbonate (BaCO3), strontium ferrite having an improved magnetic component, aluminum (Al), nickel (Ni), and cobalt (Co), without being limited thereto.

A damper 270 is disposed between an upper part of the bobbin 250 and the external frame 240, and the damper 270 has a wrinkle structure. Thus, the damper can contract or expand to adjust the up-down vibration of the bobbin based on the up-down movement of the bobbin. That is, since the damper 270 is connected to the bobbin 250 and to the external frame 240, the up-down vibration of the bobbin is restricted by the restoring force of the damper 270. Specifically, when the bobbin 250 vibrates upward beyond a predetermined height or downward beyond a predetermined level, the restoring force of the damper 270 can return the bobbin to its original position.

The damper may be expressed by another term, such as an edge.

FIG. 9B illustrates the second structure having the magnet disposed inside the coil, which may be referred to as a micro type or an internal magnet type.

In the sound generating actuator of the second structure, the lower plate 210 is fixed to a support hole 310 foiled in the cover bottom 300, the magnet 220 is disposed at a central area of the lower plate 210, and the center pole extends upward from the top of the magnet.

The upper plate 210' protrudes from a peripheral part of the lower plate, and the external frame 240 is disposed on the upper edge of the upper plate.

The bobbin 250 is disposed to surround the magnet 220 and the center pole 230, and the coil 260 is wound around the bobbin 250.

The damper 270 is disposed between the external frame 240 and the bobbin 250.

The sound generating actuator of the second structure has a smaller leakage of magnetic flux than that of the first structure and can have a smaller size. However, the sound generating actuator of the second structure may undergo reduction of magnetic flux due to heating the Neodymium (Nd) magnet, and is difficult to manufacture.

In an exemplary embodiment, the actuators of both the first structure and the second structure may be used, and the following description discusses the first structure as a representative for convenience of description.

The sound generating actuator used in a display device according to the present disclosure is not limited to the types illustrated in FIGS. 9A and 9B, and includes other types of actuators as long as the actuators can vibrate a display panel up and down to generate sound in response to application of an electric current.

Figure 10A:
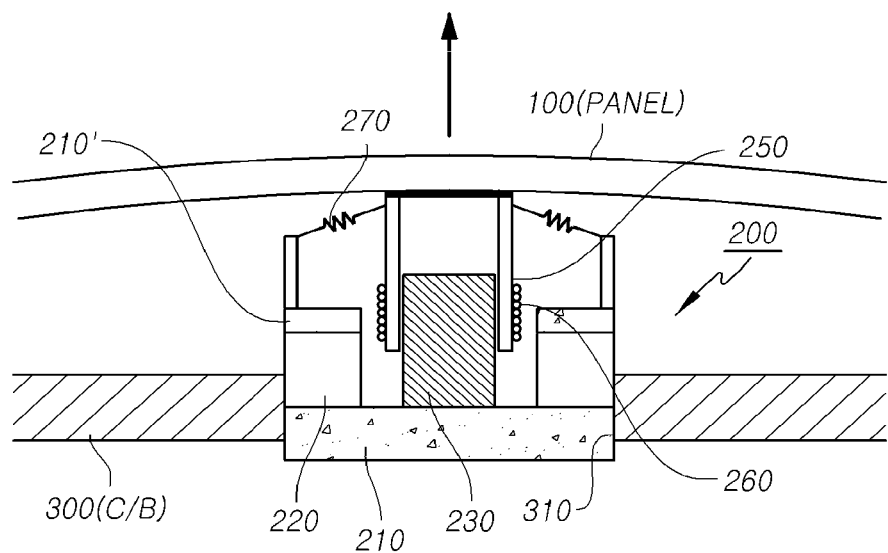
FIGS. 10A and 10B illustrate a state in which a sound generating actuator according to an embodiment of the present disclosure vibrates a display panel to generate sound.
Figure 10B:
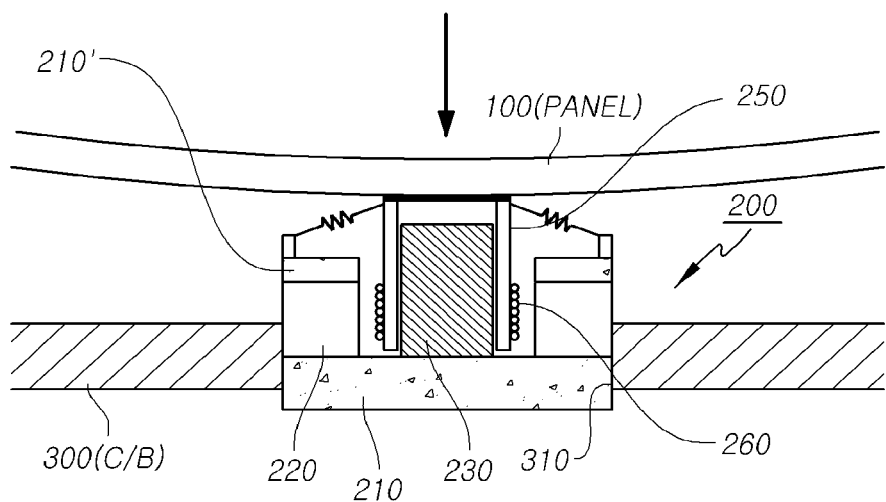

FIGS. 10A and 10B illustrate an exemplary embodiment in which a sound generating actuator vibrates an organic light emitting display panel to generate sound.

FIG. 10A illustrates a state in which the electric current has been applied, where the center pole connected to the lower surface of the magnet serves as the N pole and the upper plate connected to the upper surfaces of the magnet serves as the S pole to establish an external magnetic field between coil.

In this state, if an electric current for generating sound is applied to the coil, an applied magnetic field is generated around the coil. Together with the external magnetic field, the applied magnetic field generates a force to move the bobbin upward.

By this force, the bobbin moves upward and the organic light emitting display panel attached to the distal end of the bobbin moves upward, as shown in FIG. 10A.

In this state, if the application of the electric current is interrupted or the electric current is applied in the opposite direction, a force is generated to move the bobbin downward based on the above-discussed principles, and the display panel thus moves downward, as shown in FIG. 10B.

In this way, according to the direction and magnitude of the electric current applied to the coil, the organic light emitting display panel vibrates up and down to generate sound waves, based on the direction and magnitude of the electric current applied to the coil.

Figure 11A:
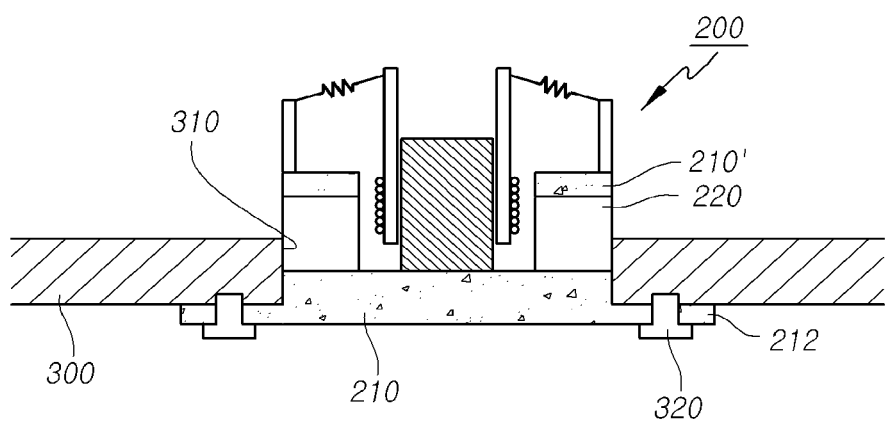
FIGS. 11A and 11B illustrate an example of a coupling state between a sound generating actuator according to an embodiment of the present disclosure and a cover bottom, which is a supporting structure of a display device.
Figure 11B:
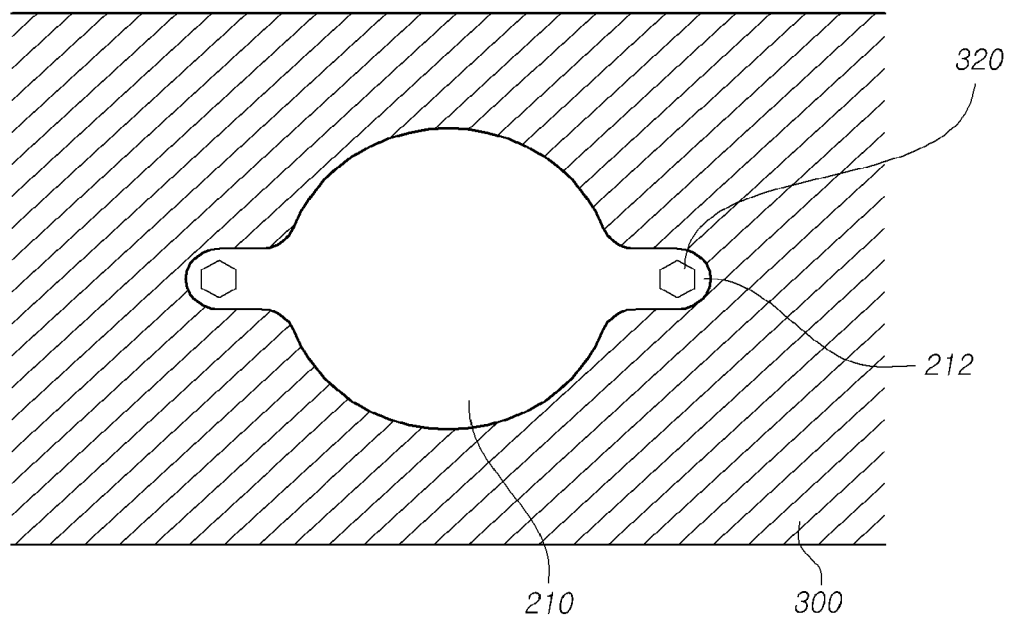
Figure 12A:
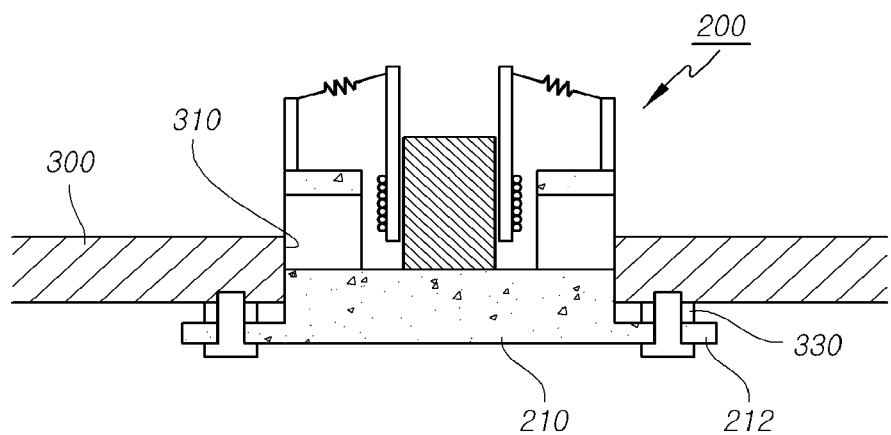
FIGS. 12A and 12B illustrate other embodiments of a coupling state between a sound generating actuator and a cover bottom.
Figure 12B:
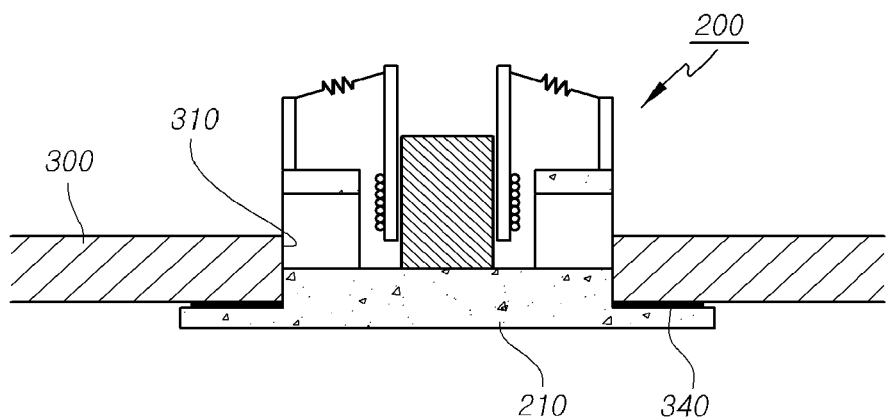

FIGS. 11A and 11B illustrate an example of a coupling state between a sound generating actuator according to an exemplary embodiment of the present disclosure and a cover bottom, which is a support part of a display device, and FIGS. 12A and 12B illustrate other embodiments of a coupling structure between the sound generating actuator and the cover bottom.

The sound generating actuator 200 according to these embodiments may be inserted through and supported by a support hole formed on a cover bottom or back cover, which is a support part of a display device. FIGS. 11A to 12B illustrate various support structures.

WIN In the support structure of FIGS. 11A and 11B, a support hole 310 is formed through the cover bottom 300, and at least one among the lower plate 210 of the sound generating actuator 200, the magnet 220, and the upper plate 210' is inserted and received in the support hole.

An extension part 212 extending outward from the lower plate is additionally formed on the lower surface of the lower plate 210, and the extension part 212 is fixed to the lower surface of the cover bottom 300 to allow the sound generating actuator 200 to be mounted to the cover bottom.

In this way, when the sound generating actuator 200 is inserted in and fixed to the support hole formed through the cover bottom, the distance between the display panel and the cover bottom can be reduced, thereby reducing the overall thickness of the display device.

In other words, although an air gap in which the display panel can vibrate should be arranged between the display panel and the cover bottom, the sound generating actuator inserted in/fixed to the support hole of the cover bottom can minimize the air gap due to the reduced height of the sound generating actuator disposed between the rear surface of the display panel and the inner surface of the cover bottom.

In the structure illustrated in FIGS. 11A and 11B, a screw hole is formed on the rear surface of the cover bottom, and a bolt 320 or a screw is fastened through the screw hole formed through the extension part 212 of the lower plate to the screw hole of the cover bottom to fix the sound generating actuator to the cover bottom.

In another exemplary embodiment, the connecting feature is not a simple screw-coupling structure. As illustrated in FIG. 12A a PEM™ nut 330 or self-clinching nut is placed to secure a predetermined distance between the cover bottom 300 and the extension part 212 of the lower plate, and the actuator is then fixed by the bolt 320.

Use of the PEM™ nut 330 or self-clinching nut as shown in FIG. 12A can secure a predetermined space between the sound generating actuator and the cover bottom 300 and thus, can minimize the transfer of vibrations of the actuator to the cover bottom.

In the structure shown in FIG. 12B, an adhesive member may be disposed between the cover bottom and the extension part 212 of the lower plate of the actuator to attach and fix them to each other. The adhesive member may be a double-sided tape.

When the adhesive member shown in FIG. 12B has a properly adjusted elasticity and thickness, the adhesive member can function as a kind of damper to minimize the transfer of the vibration of the actuator to the cover bottom.

The structure shown in FIGS. 11A to 12B, in which the sound generating actuator 200 attached to the organic light emitting display panel to directly vibrate the organic light emitting display panel is inserted in and fixed to a support hole formed through the cover bottom can reduce the thickness of the display device in comparison with a structure in which the actuator is completely received in the display device.

Figure 13:
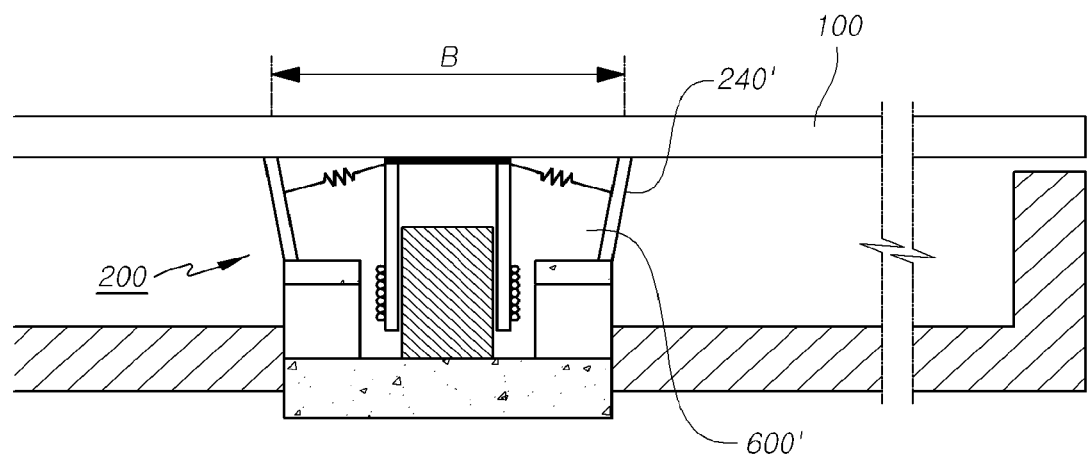
FIG. 13 illustrates a case in which an air gap configured to receive generated sound is limited by an external frame of the sound generating actuator.

FIG. 13 illustrates a case in which an air gap configured to receive the generated sound is limited by an external frame of the sound generating actuator.

As described above, in the structure according to exemplary embodiments in which an organic light emitting display panel directly vibrates to generate sound, the display panel functions in a manner similar to a vibration plate of a speaker.

In a typical sound generating apparatus, a space enclosed by a vibration plate vibrated by a bobbin and an enclosure surrounding the vibration plate is a baffle space or an air gap for transferring the vibrations.

The shape and size of the baffle space or air gap determine the sound tone or sound output characteristic. Theoretically, the larger the baffle space or the air gap, the better the performance of the apparatus.

FIG. 13 illustrates an exemplary structure in which an external frame 240' functioning as an enclosure of a speaker is disposed around the bobbin of the sound generating actuator and extends up to and is attached to the organic light emitting display panel 100.

In this structure, an area B of the organic light emitting display panel defined by the external frame 240' functions as a vibration plate. As a result, the space defined by the external frame 240' and the part B of the organic light emitting display panel is the baffle space or air gap 600'.

In the structure illustrated in FIG. 13, the baffle space or the air gap 600' and the area B of the organic light emitting display panel, which generates sound, are relatively small, and thus, the display device does not have a good sound output characteristic.

Figure 14A:
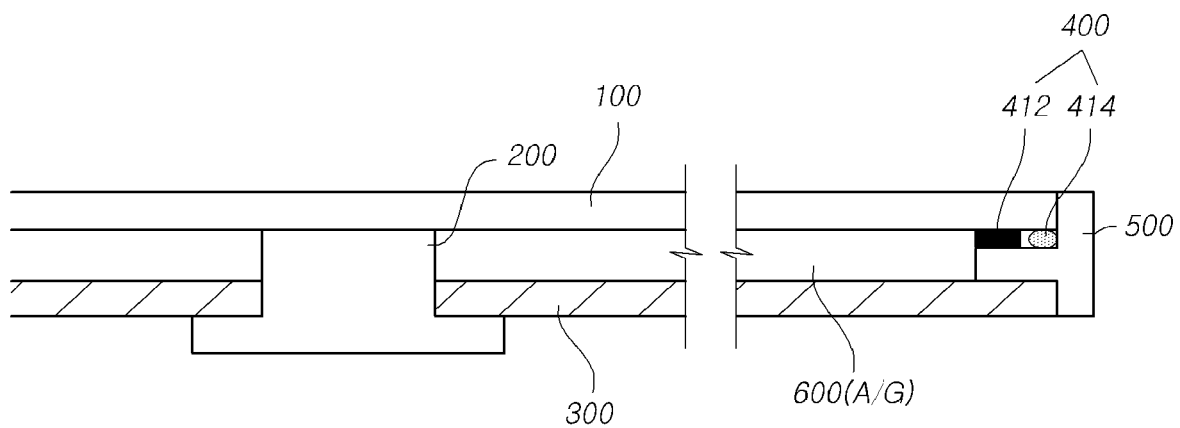
FIGS. 14A to 14C illustrate an example of a baffle part according to an embodiment of the present disclosure, formed between a display panel and a middle cabinet. The baffle part is a structure for supporting the display panel to form a sound transferring air gap between the display panel, which serves as a vibrating plate, and a cover bottom.
Figure 14B:
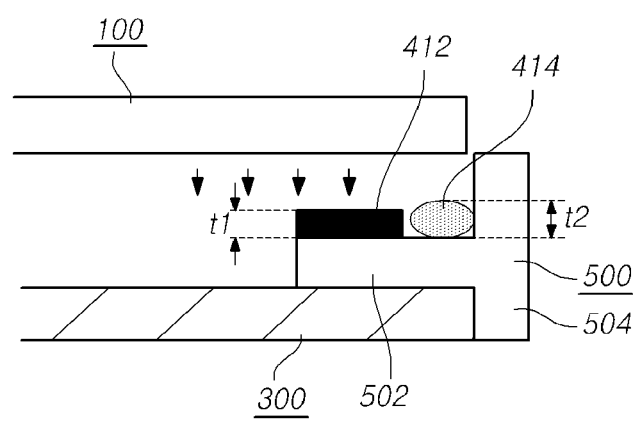
Figure 14C:
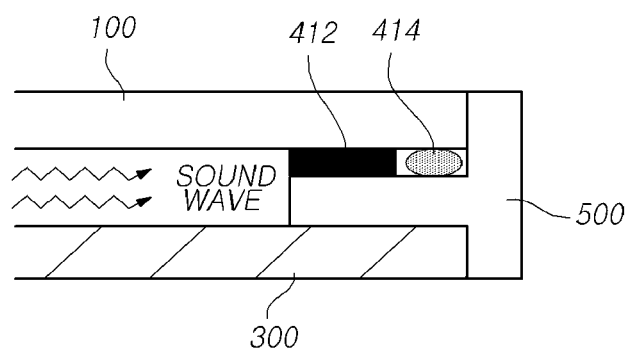

Therefore, embodiments of the present disclosure may include the baffle part 400 illustrated in FIGS. 14A to 14C in an effort to enlarge the baffle space or air gap and enhance the sealing of the space.

By arranging a baffle part having a sealing structure between an edge part of the organic light emitting display panel and a support part thereunder, the entire area of the display panel can be substantially used as a vibration plate.

FIGS. 14A to 14C illustrate an example of a baffle part formed between an organic light emitting display panel and a middle cabinet, which is a support part for the organic light emitting display panel, which forms an air gap between the organic light emitting display panel, and serves as a vibrating plate, and a cover bottom.

As shown in FIG. 14A, the panel vibration type sound generating apparatus according to an exemplary embodiment secures an air gap 600, which is a space allowing the panel to be vibrated by the sound generating actuator 200, between the organic light emitting display panel 100 and a support part (cover bottom 300).

Further, one side of the organic light emitting display panel may be coupled to the support structure of the organic light emitting display panel to generate sound waves during the vibration of the organic light emitting display panel. The generated sound should not leak to the outside through a side, and the like, of the display device.

To this end, the organic light emitting display device according to an exemplary embodiment shown in FIG. 14A has a baffle part 400 formed between the lower surface of the organic light emitting display panel and the support structure.

It is preferred that a predetermined section (that is, air gap) is defined around the sound generating actuator, a baffle part is disposed between the upper surface of the cover bottom or middle cabinet and the lower surface of the display panel at an edge of the section, and the baffle part 400 includes an adhesive member 412 between the lower surface of the display panel and the upper surface of the support structure of the display device, and a sealing part 414 disposed outside the adhesive member.

The section in which the baffle part is formed may be the entire display panel area defined by four outer sides of the display panel. However, the section is not limited to such a definition and may be defined by an area excluding the area in which a source PCB is disposed, as described below.

When two or more sound generating actuators are arranged to implement stereo or three-dimensional sound, two or more sections may be separately arranged to form the baffle part.

As shown in FIGS. 14A to 14C, the support part of the organic light emitting display device may include a middle cabinet 500, which is coupled to the cover bottom and is configured to allow a part of the display panel to be stably placed thereon, in addition to the cover bottom 300, which covers the entire rear surface of the display panel.

The middle cabinet 500 is a frame-shaped member formed along the outer periphery of the display panel, and includes a horizontal support part 502 on which a part of the display panel is stably placed, and a vertical support part 504 bent in opposite directions from the horizontal support part to cover the side surface of the cover bottom and the side surface of the display panel. Therefore, the middle cabinet may have a shape of a letter "T" in general.

The middle cabinet 500 provides an external ornamental part of the side surface of the display device or set apparatus, and may not be used or integrally foiled with the cover bottom in some cases.

According to the exemplary embodiments of FIGS. 14A to 14C, the adhesive member 412 of the baffle part 400 may be a double-sided tape disposed between the upper surface of the horizontal support part of the middle cabinet 500 and the display panel and fixes the lower surfaces of the display panel to the middle cabinet.

The sealing part 414 of the baffle part is placed outside of the adhesive member and preferably has a thickness or height larger than the thickness or height of the adhesive member.

The sealing member 414 may be made from a material having a large elasticity, such as rubber, and has a thickness t2 larger than the thickness t1 of the adhesive member 412 as illustrated in FIG. 14B.

As illustrated in FIG. 14B, one adhesive surface of the adhesive member 412, which is a double-sided tape having a thickness t1, is attached to the inner part of the upper surface of the horizontal support part 502 of the middle cabinet 500, and the sealing part 414 made of an elastic material having a thickness t2 larger than t1 is disposed outside the adhesive member.

In this state, the organic light emitting display panel 100 is attached to the other adhesive surface of the adhesive member 412. Then, the organic light emitting display panel is attached to the middle cabinet by pressing, to a certain degree, the sealing part 414 having the larger thickness, as shown in FIG. 14C.

As a result, the sealing of the air gap around the sound generating actuator and enclosing the air gap is further enhanced.

In the structure illustrated in FIG. 14C, the organic light emitting display panel 100 and the cover bottom 300 are coupled to each other while forming the air gap 600 to be as wide as the thickness of the adhesive member 412. The horizontal support part 502 of the middle cabinet can secure a vibration space in which the display panel can generate sound waves, which prevents the internally generated sound waves from leaking to the outside along the side surface of the display device.

The baffle part 400 disposed at an edge of the air gap, which has a double structure of the adhesive member 412 and the sealing part 414 while allowing the sealing part to have a larger thickness, can further enhance the sealing of the air gap and prevent leakage of the sound.

It should be construed that the middle cabinet 500 of the present disclosure may be referred to by another term, such as a guide panel, a plastic chassis, a p-chassis, a support main, a main support, or a mold frame, and includes all types of members, which are structures having a shape of a four-sided frame and having a sectional shape including multiple bent portions and are connected to the cover bottom to be used to support the display panel and the baffle part.

The middle cabinet 500 may be made of a synthetic resin, such as a polycarbonate, or a metal material, such as aluminum, and may be manufactured by a manufacturing method, such as injection molding, without being limited thereto.

Although a middle cabinet is used to support the cover bottom and the display panel in the embodiment described above, the middle cabinet may not be always required.

Therefore, in some cases, the panel may have a structure in which the cover bottom 300 supports both the first display panel and the second display panel while forming an external lateral appearance of the display device without the middle cabinet. In such a structure, the baffle part 400 may be disposed between a part of the edge of the cover bottom and the organic light emitting display panel.

When the middle cabinet does not exist, the cover bottom may have a stepped portion formed at an edge thereof and an adhesive member 412 and a sealing part 414 arranged on the upper surface of the stepped portion.

This embodiment has a simple structure without a middle support structure and includes a baffle part 400, which is disposed at an edge of the air gap and has a double structure of the adhesive member 412 and the sealing part 414 while allowing the sealing part to have a larger thickness.

The thickness of the air gap 600, that is, the distance G, shown in FIG. 9A, between the organic light emitting display panel and the cover bottom, may have a value of about 1.0 to 3.0 mm in an exemplary embodiment. However, the thickness is not limited to this range and may have a value in a different range depending on the degree of vibration of the display panel, and the like.

However, in order to reduce the thickness of the organic light emitting display device, it is preferable to minimize the thickness G of the air gap in consideration of the quantity of vibration of the display panel by the sound generating actuator, the range of sound to be output, and the quantity of output. In the present embodiment, an optimum thickness G of the air gap is about 2.0 mm.

Figure 15:
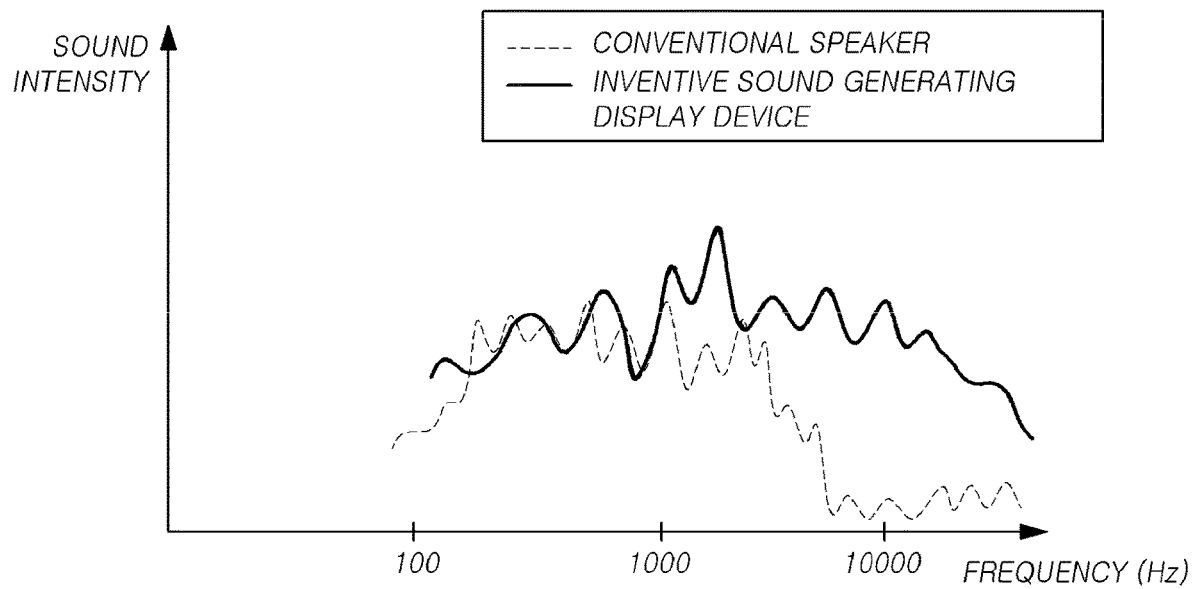
FIG. 15 is a graph illustrating a sound output characteristic when using a panel vibration type sound generating apparatus according to the present embodiment, in comparison with a conventional speaker.

FIG. 15 is a graph illustrating the sound output characteristic of a panel vibration type sound generating apparatus as described in the present disclosure, in comparison with a conventional speaker.

As a result of experimentation, a rapid sound intensity reduction (sound pressure reduction) as illustrated by the dotted line in FIG. 15 is observed in the middle/high sound range of 4000 Hz or higher when a speaker is disposed at the rear surface or the lower end of a conventional display device as shown in FIG.

In contrast, as illustrated by a solid line in FIG. 15, a structure as described in the present disclosure, in which a sound generating actuator is fixed to a support structure to directly vibrate the organic light emitting display panel, minimizes sound pressure reduction in the middle/high sound range, and can greatly improve the sound output characteristic in the high sound range.

Thus, the exemplary embodiments of the present disclosure can provide rich sound output in all sound ranges.

Embodiments of the present disclosure as described above, in which an organic light emitting display panel other than a liquid crystal display panel is used as a display panel for a display device which directly vibrates the display panel to generate sound, facilitates the arrangement of the sound generating actuator and can prevent the sound generating actuator from degrading the screen quality.

Especially, among various types of organic light emitting display panels, the bottom emission type organic light emitting display panel can prevent generation of a weighted color mixing phenomenon in a wide viewing angle at the time of panel vibration and can reduce the thickness or weight of the panel to thereby enhance the sound generation characteristic.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of configuration, are possible without departing from the essential features of the present disclosure. Therefore, the embodiments of the present disclosure are intended to illustrate the scope of the technical idea of the present invention, and the scope of the present invention is not limited to any of these embodiments. The scope of the present invention shall be construed on the basis of the accompanying claims in such a manner that all of the technical ideas included within the scope equivalent to the claims belong to the present invention.

What is claimed is:

1. An organic light emitting display device, comprising:
an organic light emitting display panel including a light emitting layer and an encapsulation layer disposed on the light emitting layer, the light emitting layer including a substrate, a plurality of thin film transistors arranged on the substrate, and an organic light emitting material layer between two electrode layers disposed on the thin film transistors;
a support structure spaced apart from the organic light emitting display panel to provide an air gap between the support structure and the organic light emitting display panel;
a sound generating actuator connected to a surface of the organic light emitting display panel and configured to vibrate the organic light emitting display panel to generate sound waves in the air gap; and
a baffle part spaced apart from the sound generating actuator and disposed between the organic light emitting display panel and the support structure at an edge of the air gap.

2. The organic light emitting display device of claim 1, wherein the organic light emitting display panel is a bottom emission type organic light emitting display panel.

3. The organic light emitting display device of claim 1, wherein the baffle part is configured to reduce leakage of the sound waves from the air gap.

4. The organic light emitting display device of claim 1, wherein the support structure supports the organic light emitting display panel and comprises a support hole through the support structure to accommodate the sound generating actuator.

5. The organic light emitting display device of claim 4, wherein the support structure covers and supports at least a rear surface of the organic light emitting display panel, and wherein the sound generating actuator is connected to the support hole.

6. The organic light emitting display device of claim 1, wherein the baffle part comprises at least one of an adhesive member and a sealing part disposed outside of the adhesive member.

7. The organic light emitting display device of claim 1, wherein the sound generating actuator is directly connected to the rear surface of the organic light emitting display panel.

8. The organic light emitting display device of claim 1, wherein at least one of the two electrode layers is formed of a transparent conductive material.

9. The organic light emitting display device of claim 1, wherein the support structure is disposed at a rear surface of the organic light emitting display panel, and an adhesive member is disposed between the support structure and the sound generating actuator.

10. An organic light emitting display device, comprising:
an organic light emitting display panel including a light emitting layer and an encapsulation layer disposed on the light emitting layer, the light emitting layer including a substrate, a plurality of thin film transistors arranged on the substrate, and an organic light emitting material layer between two electrode layers disposed on the thin film transistors; and
a sound generating actuator connected to a surface of the organic light emitting display panel and configured to vibrate the organic light emitting display panel to generate sound,
wherein the sound generating actuator comprises:
a magnet disposed on a plate;
a center pole on the plate;
a bobbin disposed to surround the center pole and be connected to the display panel; and
a coil wound around the bobbin.

11. The organic light emitting display device of claim 10, wherein the magnet is disposed outside of the coil.

12. The organic light emitting display device of claim 10, wherein the magnet is disposed inside of the coil.

13. The organic light emitting display device of claim 10, wherein the sound generating actuator further comprises an external frame above the plate, and a damper between the bobbin and the external frame.

14. The organic light emitting display device of claim 10, further comprising an adhesive member disposed between the bobbin and the display panel.

15. An organic light emitting display device, comprising:
an organic light emitting display panel;
a sound generating actuator disposed at a rear surface of the organic light emitting display panel and configured to vibrate the organic light emitting display panel to generate sound;
a support structure spaced apart from the organic light emitting display panel to provide an air gap between the support structure and the organic light emitting display panel; and
a baffle part spaced apart from the sound generating actuator and disposed at an edge of the air gap between the rear surface of the organic light emitting display panel and the support structure.

16. The organic light emitting display device of claim 15, wherein the sound generating actuator includes two or more sound generating actuators, and the baffle part includes two or more sections corresponding to the two or more sound generating actuators.

17. The organic light emitting display device of claim 16, wherein the two or more sound generating actuators generate stereo sound or three-dimensional sound.

18. The organic light emitting display device of claim 16, wherein the two or more sound generating actuators are symmetrically arranged.

19. The organic light emitting display device of claim 15, wherein the organic light emitting display panel includes a light emitting layer and an encapsulation layer disposed on the light emitting layer, the light emitting layer includes a plurality of thin film transistors on a substrate, and an organic light emitting material layer between two electrode layers on the thin film transistors.

20. The organic light emitting display device of claim 19, wherein at least one of the two electrode layers is formed of a transparent conductive material.

21. The organic light emitting display device of claim 15, wherein the sound generating actuator is configured to vibrate the organic light emitting display panel to generate sound waves in the air gap; and
wherein the baffle part is configured to reduce leakage of the sound waves from the air gap.

* * * * *